(12) United States Patent
Higashi et al.

(10) Patent No.: US 9,924,117 B2
(45) Date of Patent: Mar. 20, 2018

(54) IMAGING ELEMENT FOR USE WITH A RETINA CHIP, IMAGING APPARATUS INCLUDING THE SAME, AND SEMICONDUCTOR APPARATUS INCLUDED IN THE SAME

(71) Applicant: KABUSHIKI KAISHA TOSHIBA, Tokyo (JP)

(72) Inventors: Yusuke Higashi, Kanagawa (JP); Takao Marukame, Tokyo (JP); Masamichi Suzuki, Tokyo (JP); Koichiro Zaitsu, Kanagawa (JP); Haiyang Peng, Kanagawa (JP); Hiroki Noguchi, Kanagawa (JP); Yuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 14/847,891

(22) Filed: Sep. 8, 2015

(65) Prior Publication Data
US 2016/0088243 A1 Mar. 24, 2016

(30) Foreign Application Priority Data
Sep. 19, 2014 (JP) .................. 2014-191008

(51) Int. Cl.
*H04N 5/335* (2011.01)
*H04N 5/341* (2011.01)
(Continued)

(52) U.S. Cl.
CPC ......... *H04N 5/341* (2013.01); *H01L 27/1464* (2013.01); *H01L 27/1469* (2013.01);
(Continued)

(58) Field of Classification Search
CPC .................................................. H04N 5/3745
See application file for complete search history.

(56) References Cited

U.S. PATENT DOCUMENTS 5,047,847 A * 9/1991 Toda .................. A61B 1/05
348/345
2003/0198096 A1 10/2003 Kunikiyo
(Continued)

FOREIGN PATENT DOCUMENTS

JP 2-250474 10/1990
JP 8-168050 6/1996
(Continued)

OTHER PUBLICATIONS

Keisuke Inoue et al., "Real time parallel image processing using a silicon retina and FPGA circuits", *The Journal of the Institute of Image Information and Television Engineers*, vol. 61, No. 3, pp. 316-324 (2007).
(Continued)

*Primary Examiner* — Gary C Vieaux
(74) *Attorney, Agent, or Firm* — Finnegan, Henderson, Farabow, Garrett & Dunner, L.L.P.

(57) ABSTRACT

According to an embodiment, an imaging element includes a plurality of light receiving elements, a plurality of scanning circuits, a first line comprising a plurality of nodes, and a plurality of first variable resistance elements. The plurality of scanning circuits are respectively connected to the plurality of light receiving elements. Each of the plurality of first variable resistance elements is connected between the corresponding one of the nodes and a corresponding one of the scanning circuits. At least one of the first variable resistance elements includes a plurality of resistance elements connected to each other in parallel.

20 Claims, 30 Drawing Sheets

(51) Int. Cl.
*H04N 5/374* (2011.01)
*H04N 5/3745* (2011.01)
*H04N 5/378* (2011.01)
*H01L 27/146* (2006.01)
*G11C 13/00* (2006.01)
*G11C 11/15* (2006.01)
*G11C 19/28* (2006.01)
*G11C 11/16* (2006.01)

(52) U.S. Cl.
CPC .. *H01L 27/14612* (2013.01); *H01L 27/14634* (2013.01); *H01L 27/14636* (2013.01); *H04N 5/374* (2013.01); *H04N 5/378* (2013.01); *H04N 5/3745* (2013.01); *G11C 11/15* (2013.01); *G11C 11/16* (2013.01); *G11C 13/0002* (2013.01); *G11C 19/28* (2013.01)

(56) References Cited

U.S. PATENT DOCUMENTS

| | | |
|---|---|---|
| 2003/0230733 A1 | 12/2003 | Tanaka |
| 2004/0222986 A1* | 11/2004 | Kasai .................. G09G 3/325 345/213 |
| 2005/0062853 A1 | 3/2005 | Yagi et al. |
| 2007/0029484 A1* | 2/2007 | Anderson ................ G01J 5/22 250/338.1 |
| 2010/0276572 A1 | 11/2010 | Iwabuchi et al. |
| 2011/0234830 A1 | 9/2011 | Kiyota et al. |
| 2014/0131556 A1 | 5/2014 | Abukawa et al. |

FOREIGN PATENT DOCUMENTS

| | | |
|---|---|---|
| JP | 10-148570 | 6/1998 |
| JP | 2001-184447 | 7/2001 |
| JP | 2003-78829 | 3/2003 |
| JP | 2003-303942 | 10/2003 |
| JP | 2004-20325 | 1/2004 |
| JP | 2011-199050 | 10/2011 |
| JP | 2011-204797 | 10/2011 |
| JP | 2012-216724 | 11/2012 |
| JP | 2014-96512 | 5/2014 |
| JP | 2015-056700 | 3/2015 |
| WO | WO 2006/129762 | 12/2006 |
| WO | WO 2015037689 A1 * | 3/2015 ........... H04N 5/3745 |

OTHER PUBLICATIONS

Yagi et al., "A Parallel Analog Intelligent Vision Sensor with a Variable Receptive Field," Journal of the Institute of Electronics, Information and Communication Engineers D-1 (Feb. 1998), J81 D-1:104-113.

* cited by examiner

IMAGING ELEMENT FOR USE WITH A RETINA CHIP, IMAGING APPARATUS INCLUDING THE SAME, AND SEMICONDUCTOR APPARATUS INCLUDED IN THE SAME

CROSS-REFERENCE TO RELATED APPLICATION

This application is based upon and claims the benefit of priority from Japanese Patent Application No. 2014-191008, filed on Sep. 19, 2014; the entire contents of which are incorporated herein by reference.

FIELD

An embodiment described herein relate generally to an imaging element, an imaging apparatus, and a semiconductor apparatus.

BACKGROUND

In a related art, in an image recognition technique, image processing such as smoothing processing of an image, differential processing on images with different degrees of smoothness, minimum value/maximum value extraction (feature point extraction) processing after differential processing, or feature point calculation processing to calculate a light quantity value gradient information or the like near a feature point is performed as basic processing.

Also, as a technique to perform these kinds of processing at high speed, there is a silicon retina chip technique which imitates a retinal neuron of a body. In this technique, pixels formed on a semiconductor substrate are connected to each other through a variable resistance circuit including a metal-oxide-semiconductor field-effect transistor (MOSFET) and smoothing processing between the pixels is performed, at high speed. However, in the above silicon retina chip, while it is possible to increase a speed of smoothing processing, a pixel area where a variable resistance circuit is to be provided is increased in a pixel region of a semiconductor substrate. Thus, there is a case where the number of pixels is decreased compared to that of a normal image sensor.

DETAILED DESCRIPTION

According to an embodiment, an imaging element includes a plurality of light receiving elements, a plurality of scanning circuits, a plurality of second wiring lines, and a plurality of first variable resistance elements. The plurality of scanning circuits are respectively connected to the plurality of light receiving elements. The plurality of second wiring lines are arranged to branch from a first wiring line. Each second wiring line is connected to any one of the plurality of scanning circuits. Each of the plurality of first variable resistance elements is electrically provided between any one of a plurality of branch points of the plurality of second wiring lines from the first wiring line and a corresponding scanning circuit. Each of the first variable resistance elements includes a plurality of resistance elements connected to each other in parallel.

In the following, an imaging element, an imaging apparatus, and a semiconductor apparatus according to an exemplified embodiment will be described in detail with reference to the attached drawings.

First Embodiment

Figure 1:
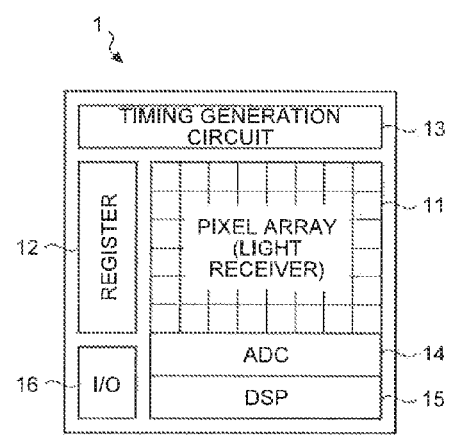
FIG. 1 is an overhead view illustrating a schematic configuration of an imaging apparatus according to a first embodiment.

First, an imaging element, an imaging apparatus, and a semiconductor apparatus according to the first embodiment will be described in detail with reference to the drawings. FIG. 1 is an overhead view illustrating a schematic configuration of the imaging apparatus according to the first embodiment. As illustrated in FIG. 1, an imaging apparatus 1 includes a pixel array 11 as an imaging element, a register 12, a timing generation circuit 13, an analog-to-digital converter (ADC) 14, a digital signal processor (DSP) 15, and an input/output (I/O) 16.

Figure 2:
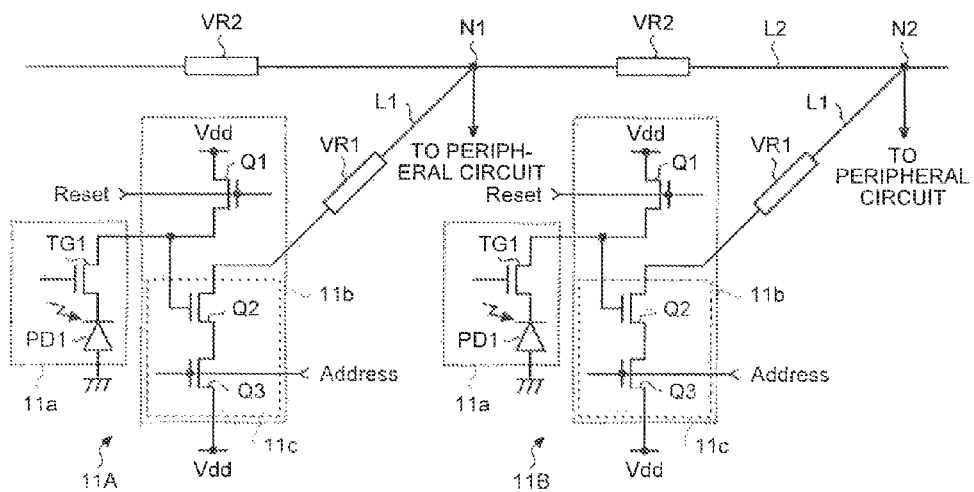
FIG. 2 is a circuit diagram, illustrating a schematic configuration example of an imaging element according to the first embodiment.

The pixel array 11 is an imaging element in which a plurality of pixels (hereinafter, referred to as pixel cell) each of which includes a light receiving element is arrayed two-dimensionally. FIG. 2 is a circuit diagram illustrating a schematic configuration example of an imaging element according to the first embodiment. Note that in FIG. 2, a configuration in which two pixel cells 11A and 11B are connected to one first wiring line L2 is illustrated as an example. However, the pixel array 11 in FIG. 1 may include a configuration in which a plurality of pixel cells is respectively connected to a plurality of wiring lines.

As illustrated in FIG. 2, the pixel cell 11A includes a light receiver 11a and a scanning circuit 11b. The light receiver 11a includes a photodiode PD1 and a transfer gate TG1. The scanning circuit 11b includes a reset transistor Q1 and an amplifier circuit 11c. The amplifier circuit 11c is a source follower circuit including two MOSFETs (hereinafter, referred to as MOS transistor) Q2 and Q3 sources of which are connected to each other. The MOS transistor Q2 of the two MOS transistors Q2 and Q3 is an amplifier transistor to amplify a potential, which corresponds to a charge accumulated in the light receiver 11a, at a predetermined gain and the MOS transistor Q3 is a switching transistor to select a pixel cell to be an object of reading. In the following, the MOS transistor Q2 will be referred to as an amplifier transistor Q2 and the MOS transistor Q3 will be referred to as a switching transistor Q3. Note that the MOS transistor Q3 may be connected to a source side of the MOS transistor Q2 which is an amplifier transistor or may be omitted from a pixel unit including the light receiver 11a and the scanning circuit 11b.

A cathode of the photodiode PD1 in the light receiver 11a is connected to a gate of the amplifier transistor Q2 in the amplifier circuit 11c of the scanning circuit 11b through the transfer gate TG1. The photodiode PD1 receives incident light and converts the light into an electron. The transfer gate TG1 transfers the electron generated in the photodiode PD1 to a charge accumulation region called a floating diffusion (FD). As a result, a charge corresponding to intensity of the incident light is accumulated in the charge accumulation region.

To the gate of the amplifier transistor Q2, a power line Vdd is also connected through the reset transistor Q1. To a gate of the reset transistor Q1, a reset signal Reset to reset the charge accumulated in the charge accumulation region is applied. That is, the reset transistor Q1 is configured to reset a potential of the charge accumulation region before a signal is read from the light receiver 11a (pixel).

Also, to a gate of the switching transistor Q3 in the amplifier circuit 11c, an address signal Address to control charge reading is input from the light receiver 11a. A source of the amplifier transistor Q2 in the amplifier circuit 11c is connected to a node N1 of the first wiring line L2 through a second wiring line L1 including a variable resistance element VR1. Thus, a gate potential corresponding to a charge accumulated in the charge accumulation region through the transfer gate TG1 is generated in the gate of the amplifier transistor Q2. The amplifier circuit 11c is a source follower circuit. Thus, the gate potential generated in the gate of the amplifier transistor Q2 is converted into a source potential of the amplifier transistor Q2. As a result, the source potential of the amplifier transistor Q2 becomes a potential corresponding to a light quantity received in the photodiode PD1. The source potential is applied to the node N1 through the variable resistance element VR1 on the second wiring line L1.

The above-described configuration of the pixel cell 11A is similar to those of the pixel cell 11B and a different pixel cell (not illustrated). Thus, for example, in a case of the pixel cell 11B, when an address signal Address is applied to the switching transistor Q3 while a selection signal is applied to the transfer gate TG1, a gate potential of the amplifier transistor Q2 corresponding to the charge accumulated in the charge accumulation region is converted into a source potential and is applied to a node N2 trough the variable resistance element VR1 on the second wiring line L1.

Also, to a first wiring line L2 between adjoining pixel cells (such as pixel cell 11A and 11B) in the plurality of pixel cells connected to the same first wiring line L2, a variable resistance element VR2 is provided. For example, the variable resistance element VR2 is provided between nodes N1 and N2 where the adjoining pixel cells 11A and 11B are connected to the first wiring line L2. Thus, a voltage value (light quantity value) output from, each of the nodes N1 and N2 to a peripheral circuit is a value smoothed according to a ratio R1/R2 between a resistance value R1 of the variable resistance element VR1 provided on the second wiring line L1 and a resistance value R2 of the variable resistance element VR2 on the first wiring line L2. Note that smoothing is to reduce a difference between luminance values of adjoining pixels and to smooth an edge in an image.

When the ratio R1/R2 is large, a degree of smoothness is high and when R1/R2 is small, a degree of smoothness is low. For example, when the resistance value R2 is made much larger than the resistance value R1, a voltage value (light quantity value) output from each of the nodes N1 and N2 is not smoothed much. Thus, substantially row image data is read from the pixel array 11. On the other hand, when the resistance value R2 is made small with respect to the resistance value R1, a voltage value (light quantity value) output, from each of the nodes N1 and N2 is smoothed in a relatively high degree. Thus, image data which is smoothed greatly is read from the pixel array 11. In such a manner, by changing the ratio R1/R2, it is possible to generate pieces of image data with different degrees of smoothness. Accordingly, analog-smoothing of a pixel and generation of a Gaussian pyramid including a plurality of pieces of image information with different degrees of smoothness can be performed while preventing a pixel area in the pixel array 11 from being increased as much as possible. Also, by performing differential processing of images with different degrees of smoothness or performing feature point extraction and feature amount extraction in a peripheral circuit unit, it becomes possible to perform basic processing necessary for image recognition processing at high speed. For example, by executing differential processing with respect to two pieces of image data read from the pixel array 11 as pieces of image data with different degrees of smoothness, a so-called edge image from which an edge is extracted can be generated at high speed. Note that the differential processing of images with different degrees of smoothness, the feature point extraction processing, and the feature amount extraction processing are not necessarily executed by a peripheral circuit but may be executed by an application software executed in an information processing apparatus such as a central processing unit (CPU).

Note that in FIG. 2, pixel cells adjoining to each other in one dimensional direction are connected to each other through the variable resistance element VR2. However, adjoining pixel cells in up/down and right/left directions may be connected to each other through the variable resistance element VR2. When the variable resistance element VR2 is provided between the pixel cells adjoining in one dimensional direction, one-dimensionally-smoothed image data can be extracted from the pixel array 11. On the other hand, when the variable resistance element VR2 is provided between pixel cells adjoining in up/down and right/left directions, two-dimensionally-smoothed image data can be extracted from the pixel array 11.

For example, as each of the variable resistance elements VR1 and VR2, a MOS transistor can be used. However, a variable resistance element is not limited to the MOS transistor and can be modified in various ways as the long as a resistance value can be changed in the resistance element. For example, a two-terminal variable resistance element such as a ReRaM, an MRAM, a PRAM, an ion memory, an amorphous silicon memory, or a polysilicon memory can be used as at least one of the variable resistance elements VR1 and VR2. Also, a variable resistance circuit including a plurality of transistors may be provided in a wiring line layer 11L instead of each of the variable resistance elements VR1 and VR2. In addition, it is also possible to include a configuration in which a resistance value is changed by switching a plurality of resistance element arrays including different resistance values.

Figure 3:
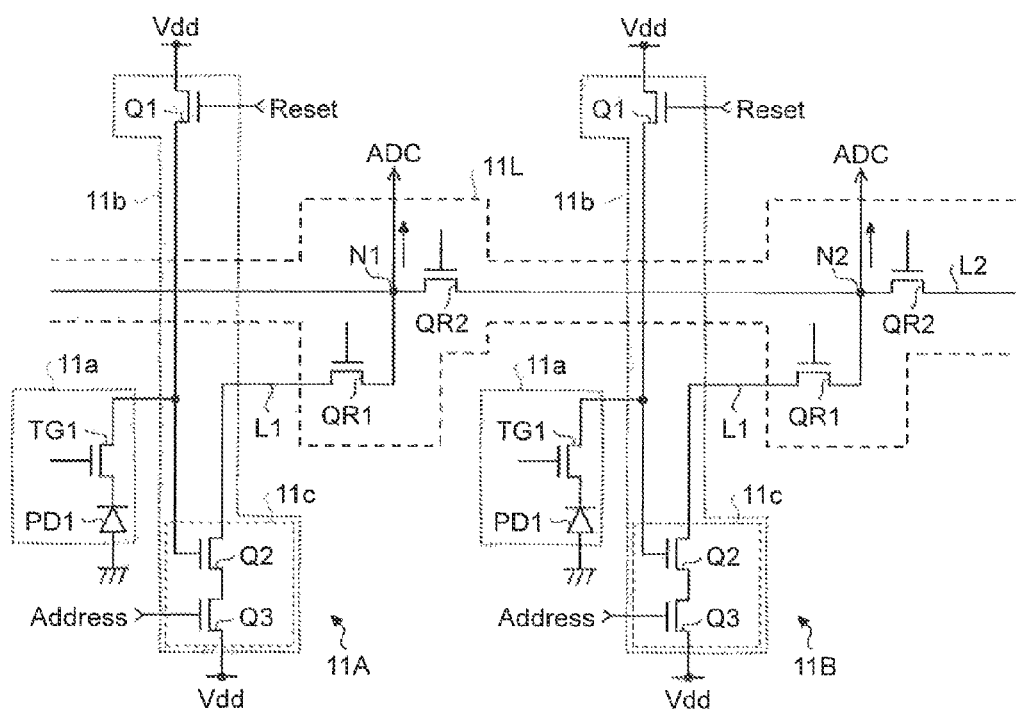
FIG. 3 is a circuit diagram illustrating a schematic configuration example of an imaging element in which a MOS transistor is used as a variable resistance element in the first embodiment.
Figure 4:
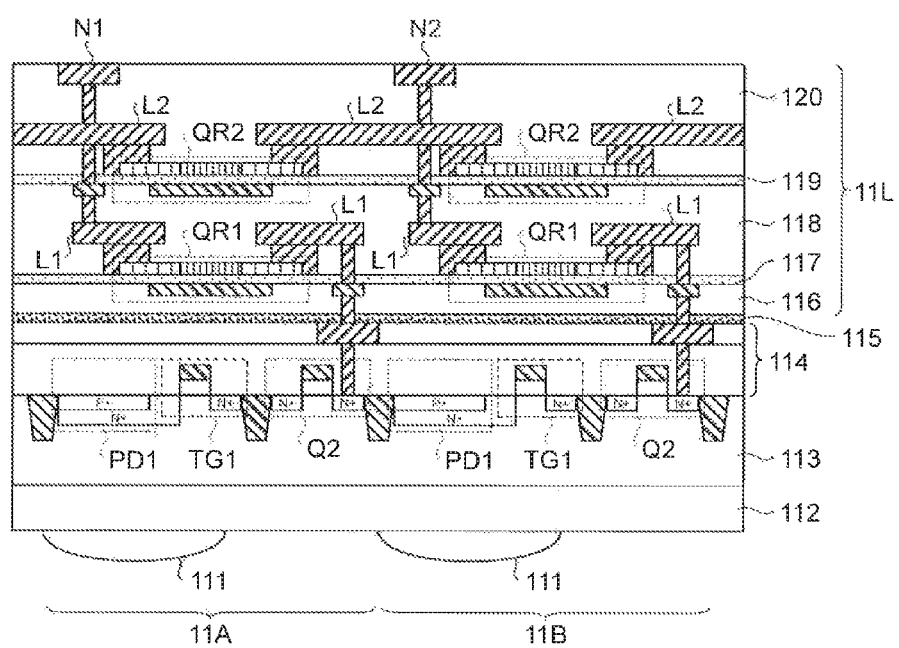
FIG. 4 is a view illustrating a cross-sectional structure example of a semiconductor apparatus according to the first embodiment.

FIG. 3 is a circuit diagram illustrating a schematic configuration example of an imaging element in which a MOS transistor is used as a variable resistance element. As illustrated in FIG. 3, each of MOS transistors QR1 and QR2 used as the variable resistance elements VR1 and VR2 is connected to the wiring line layer 11L to connect adjoining pixels (such as pixel cell 11A and 11B). In FIG. 4, a cross-sectional structure example of a semiconductor apparatus to realize the circuit configuration illustrated in FIG. 3 is illustrated. Note that in FIG. 4, for convenience of description, the reset transistor Q1 and the switching transistor Q3 in the amplifier circuit 11c are omitted. Also, in FIG. 4, a rear surface irradiation-type semiconductor apparatus is illustrated but this is not the limitation. A surface irradiation-type semiconductor apparatus may be used.

As illustrated in a semiconductor apparatus in FIG. 4, one pixel cell 11A includes a semiconductor substrate 113 in which the photodiode PD1, the transfer gate TG1, and the amplifier transistor Q2 are arranged in matrix on a first surface (this is assumed as upper surface). To a second surface (this is assumed as rear surface) of the semiconductor substrate 113, a color filter 112 is joined. Also, on a surface of the color filter 112 which surface is or a rear side of a joint surface with the semiconductor substrate 113, a microlens 111 a position of which is adjusted to that of the photodiode PD1 is provided. Note that light with a certain wavelength corresponding to the color filter 112 can pass from the microlens 111 to the photodiode PD1. For example, a through-hole may be formed in the semiconductor substrate 113 between the microlens 111 and the photodiode PD1 or a transparent substrate may be used as the semiconductor substrate 113.

On the upper surface of the semiconductor substrate 113, a contact layer 114 is formed. In the contact layer 114, a via for electrically extracting a source of the amplifier transistor Q2 is formed. On an upper part of the via, a pad to make it easier to perform alignment with an upper layer may be formed. Also, on the contact layer 114, a diffusion prevention film 115 to prevent atomic diffusion between layers is formed.

On the diffusion prevention film 115, the wiring line layer 11L including interlayer insulation films 116 and 118 and a passivation 120 is formed. More specifically, on the diffusion prevention film 115, the interlayer insulation films 116 and 118 are formed. Between the interlayer insulation films 116 and 118, a gate insulation film 117 is formed. The MOS transistor QR1 (see FIG. 3) is formed in such a manner as to sandwich the gate insulation film 117. Also, in each of the diffusion prevention film 115, the interlayer insulation film 116, the gate insulation film 117, and the interlayer insulation film 118, a via and a wiring line layer to electrically connect a via, which is electrically extracted to an upper part of the contact layer 114, to a drain of the MOS transistor QR1 is formed as a part of the second wiring line L1.

A source of the MOS transistor QR1 is electrically extracted onto the interlayer insulation film 118 through the via formed on the interlayer insulation film 118. On an upper part of the via, a pad to make it easier to perform alignment with an upper layer may be formed. On the interlayer insulation film 118, a gate insulation film 119 and the passivation 120 are formed.

The first wiring line L2 in FIG. 3 is formed in the passivation 120. The MOS transistor QR2 is formed in such a manner as to sandwich the gate insulation film 119. The source of the MOS transistor QR1 which source is electrically extracted onto the interlayer insulation film 118 is electrically connected to the first wiring line L2 through the via formed in the gate insulation film 119 and the passivation 120 as a part of the second wiring line L2. Also, the node N1 of the first wiring line L2 is electrically extracted onto a surface of the passivation 120 through the via formed in the passivation 120. On an upper part of the via, a pad to make it easier to perform alignment with a different substrate (such as circuit substrate) during joining may be formed.

Note that a semiconductor layer used for the MOS transistors QR1 and QR2 may be an oxide semiconductor such as InGaZnO or ZnO or may be Poly-Si, amorphous Si, SiGe, or the like. The semiconductor layer may be a laminated film including a plurality of different kinds of films. As a laminated film, for example, InGaZnO, $Al_2O_3$, InGaZnO, $Al_2O_3$, or the like can be used. Also, as the via and the wiring line layer formed in each of the interlayer insulation films 116 and 118 and the passivation 120, various conductive layers such as a metal wiring line or a semiconductor layer doped with an impurity can be used.

As described above, by providing, as variable resistance elements VR1 and VR2, the MOS transistors QR1 and QR2 on the wiring line layer 11L formed on the semiconductor substrate 113, it becomes possible to perform smoothing processing of image data by analog processing at high speed without increasing a pixel area.

Note that a cross-sectional structure illustrated in FIG. 4 is just an example. For example, structures of the MOS transistors QR1 and QR2 formed on the wiring line layer 11L are not limited to the example. For example, each of the MOS transistors QR1 and QR2 may include a double-gate structure in which gate electrodes are provided on both of upper and lower sides of a semiconductor layer. Also, a cross-sectional arrangement of each wiring line is not limited to what is illustrated in FIG. 4. For example, arrangement may be performed in such a manner that a gate width direction of the MOS transistor QR1 in a lower layer and a gate width direction of the MOS transistor QR2 in an upper layer are orthogonal to each other. Also, arrangement of each transistor (including photodiode PD1) formed in the semiconductor substrate 113 is not limited to the arrangement illustrated in FIG. 4.

Then, a production method of the semiconductor apparatus according to the first embodiment will be described in detail with reference to the drawings. FIG. 5 to FIG. 9 are cross-sectional views of processes, the views illustrating the production method of the semiconductor apparatus illustrated, for example, in FIG. 4. Note that FIG. 5 to FIG. 9 are views illustrating an example of the production method of the semiconductor apparatus illustrated in FIG. 4 and these processes are not the limitation.

Figure 5:
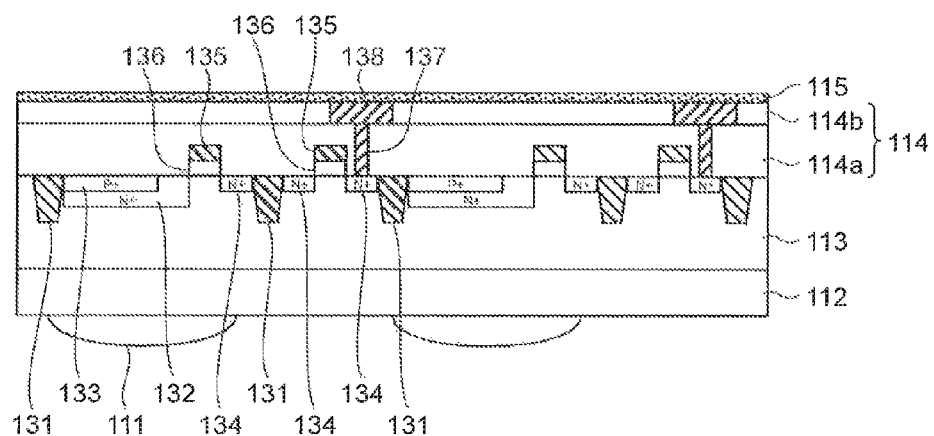
FIG. 5 is a first cross-sectional view illustrating a production process of the semiconductor apparatus according to the first embodiment.

First, as illustrated in FIG. 5, similarly to a conventional CMOS image sensor, an element isolation layer 131 is formed on an upper surface of the semiconductor substrate 113 and a gate insulation film 136 and a gate electrode 135 are serially formed. Then, by arbitrarily implanting an n-type dopant and a p-type dopant into a predetermined region or an upper surface of the semiconductor substrate 113 by ion implantation with masking or self-alignment, $n^+$-type doped regions 132 and 134 and a $p^+$-type doped region 133 are formed. Then, the contact layer 114a which is an insulation layer is formed on the semiconductor substrate 113 and a via 137 to electrically extract the source of the MOS transistor Q2 is formed in the contact layer 114a. Then, a pad 138 is formed on the contact layer 114a in which the via 137 is formed. After a contact layer 114b is formed on the contact layer 114a on which the pad 138 is formed, sin upper surface of the pad 138 is exposed, for example, by CMP. Then, the diffusion prevention film 115 is formed on the smoothed contact layer 114b.

Figure 6:
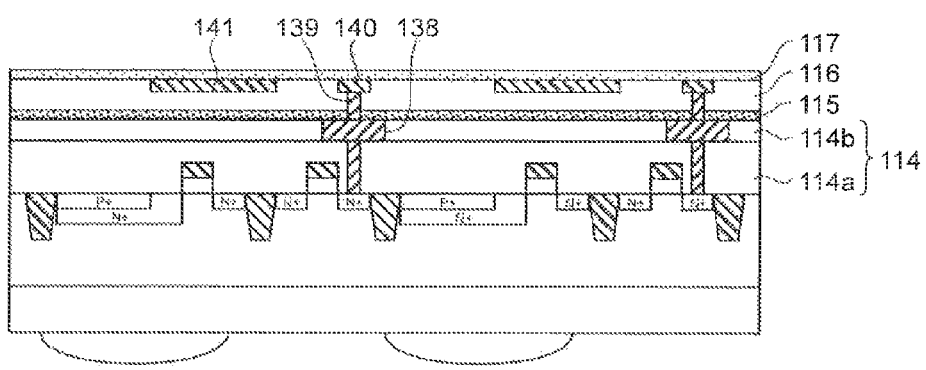
FIG. 6 is a second cross-sectional view illustrating a production process of the semiconductor apparatus according to the first embodiment.

Then, as illustrated in FIG. 6, the interlayer insulation film 116 is formed on the diffusion prevention film 115 and a via 139 to electrically extract the pad 138 is formed in the interlayer insulation film 116. Then, a pad 140 is formed on the via 139 and a gate electrode 141 of the MOS transistor QR1 is formed. Note that as the pad 140 and the gate electrode 141, metal such as copper (Cu) may be used. Then, the gate insulation film 117 is formed on the gate electrode 141 by a plasma CVD method or the like.

Figure 7:
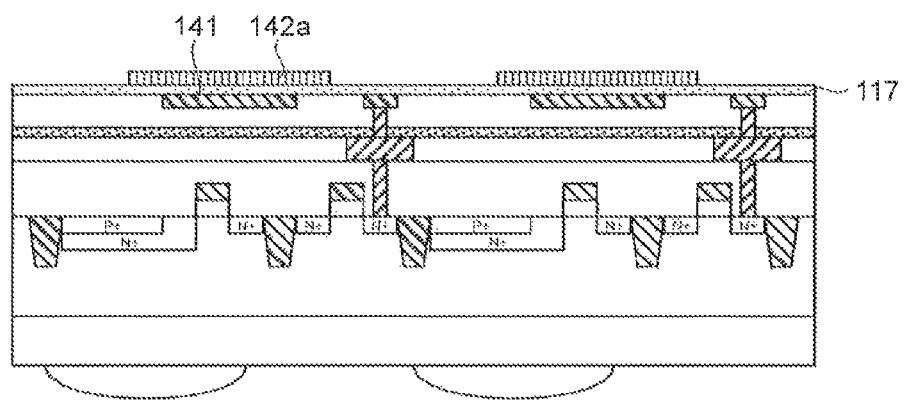
FIG. 7 is a third cross-sectional view illustrating a production process of the semiconductor apparatus according to the first embodiment.

Then, as illustrated in FIG. 7, a semiconductor layer 142a is formed on the gate insulation film 117 and a part of the layer is selectively removed. Here, when the semiconductor layer 142a is an oxide semiconductor such as InGaZnO, the layer can be formed, for example, by a sputtering method. Also, when the semiconductor layer 142a is polysilicon or amorphous silicon, the layer can be formed, for example, by a plasma CVD method.

Figure 8:
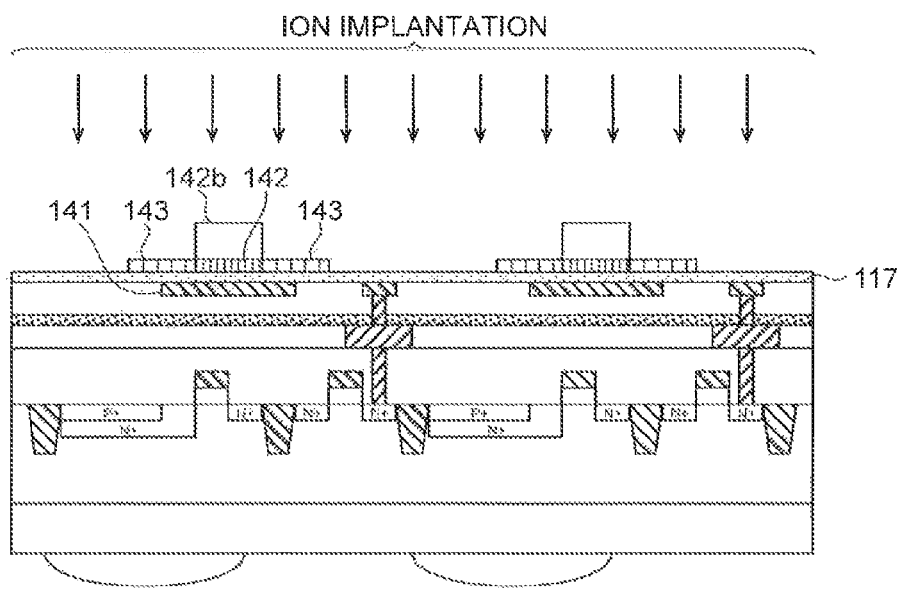
FIG. 8 is a fourth cross-sectional view illustrating a production process of the semiconductor apparatus according to the first embodiment.

Then, as illustrated in FIG. 8, by forming a mask pattern 142b on the semiconductor layer 142a and implanting a dopant into the semiconductor layer 142a by an ion implantation method, a channel region 141 is formed, and a source region 143 and a drain region 143 are formed on the semiconductor layer 142a. Here, when the semiconductor layer 142a is an oxide semiconductor, the source region 143 and the drain region 143 can be formed by a method to form an oxygen defect region by reduction plasma such as hydrogen plasma or a method to introduce nitrogen by nitrogen-containing plasma such as ammonia. Also, when the semiconductor layer 142a is Poly-Si, amorphous Si, or SiGe, the source region 143 and the drain region 143 can be formed by implantation of an impurity such as phosphorus, arsenic, or boron.

Figure 9:
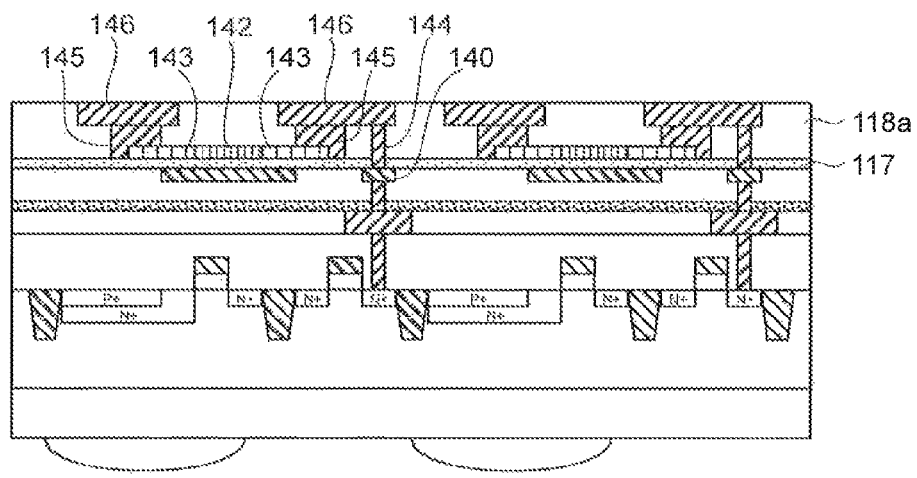
FIG. 9 is a fifth cross-sectional view illustrating a production process of the semiconductor apparatus according to the first embodiment.

Next, as illustrated in FIG. 9, after the mask pattern 142b is removed, vias 144 and 145 and the wiring line layer 146 are formed in such a manner as to overlap with the source region 143, drain region 143, and the pad 140.

Then, by performing processes similar to those in FIG. 6 to FIG. 9 which have been described above, the MOS transistor QR2 in an upper layer is formed. By connecting the MOS transistor QR2 with the wiring line layer L2 such as a metal layer, a semiconductor apparatus including a cross-sectional structure such as what is illustrated in FIG. 4 is produced.

As described above, according to the first embodiment, adjoining pixels (such as pixel cell 11A and 11B) are connected to each other through the variable resistance element VR2. Thus, it becomes possible to perform smoothing processing of image data by analog processing at high speed without increasing a pixel area.

Also, in a case where a silicon retina chip is used, it may be necessary to recreate a special pixel layout. However, in the first embodiment, the variable resistance element VR2 is formed in the wiring line layer 11L. Thus, an imaging element including a basic processing function necessary for image recognition can be realized without substantially changing the pixel layout of the pixel array 11.

Note that image processing such as differential processing on images with different degrees of smoothness, minimum value/maximum value extraction (feature point extraction) processing after differential processing, or feature point calculation processing to calculate light quantity value gradient information or the like near a feature point may be performed in a peripheral circuit part or in an outside of an imaging element, and thus, a detail description thereof is omitted here.

Second Embodiment

Then, an imaging element, an imaging apparatus, and a semiconductor apparatus according to the second embodiment will be described in detail with reference to the drawings.

As described above, smoothness of image data read from a pixel array 11 is determined by a resistance ratio R1/R2 between variable resistance elements VR1 and VR2. The resistance ratio R1/R2 can be adjusted by changing at least one of the resistance values R1 and R2. In other words, one of the resistance values R1 and R2 can be a fixed value. Thus, in the second embodiment, a non-variable resistance element in which a resistance value is non-variable is used instead of a variable resistance element VR1 on a second wiring line L1. However, this is not the limitation. Instead of a variable resistance element VR2 on a first wiring line L2, a non-variable resistance element may be used.

Figure 10:
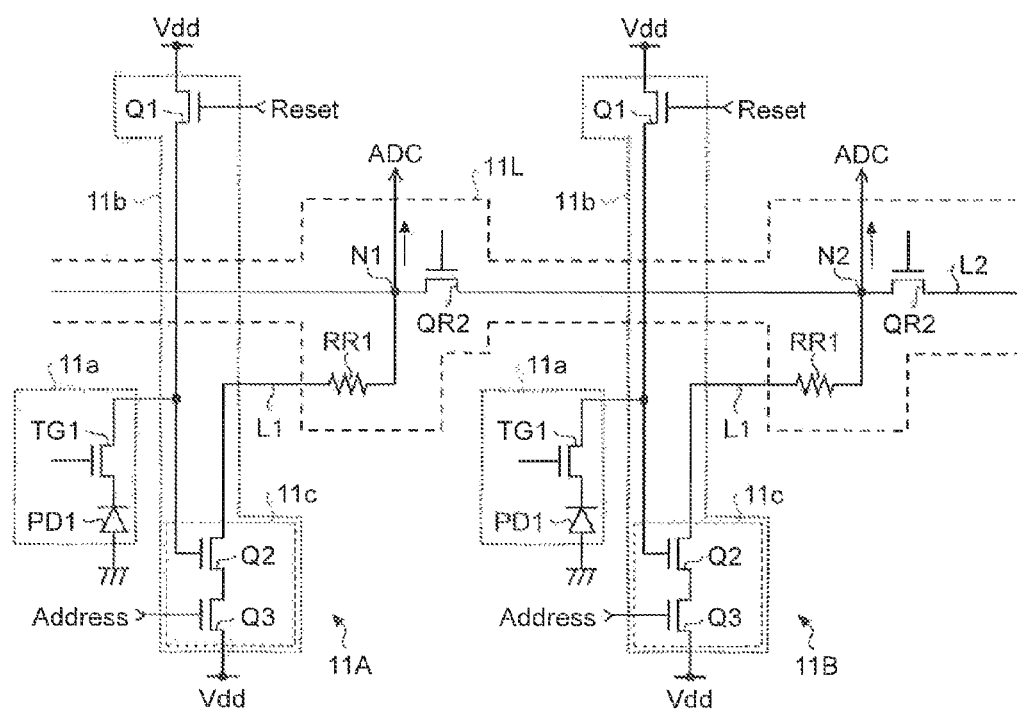
FIG. 10 is a circuit diagram illustrating a schematic configuration example of an imaging element according to a second embodiment.

FIG. 10 is a circuit diagram illustrating a schematic configuration example of an imaging element according to the second embodiment. As it is obvious from comparison between FIG. 10 and FIG. 3, in the second embodiment, a MOS transistor QR1 on a second wiring line L1, which connects pixel cells 11A and 11B to a first wiring line L2, is replaced by a non-variable resistance element RR1. The other configuration may be similar to that of the imaging element illustrated in FIG. 3.

Figure 11:
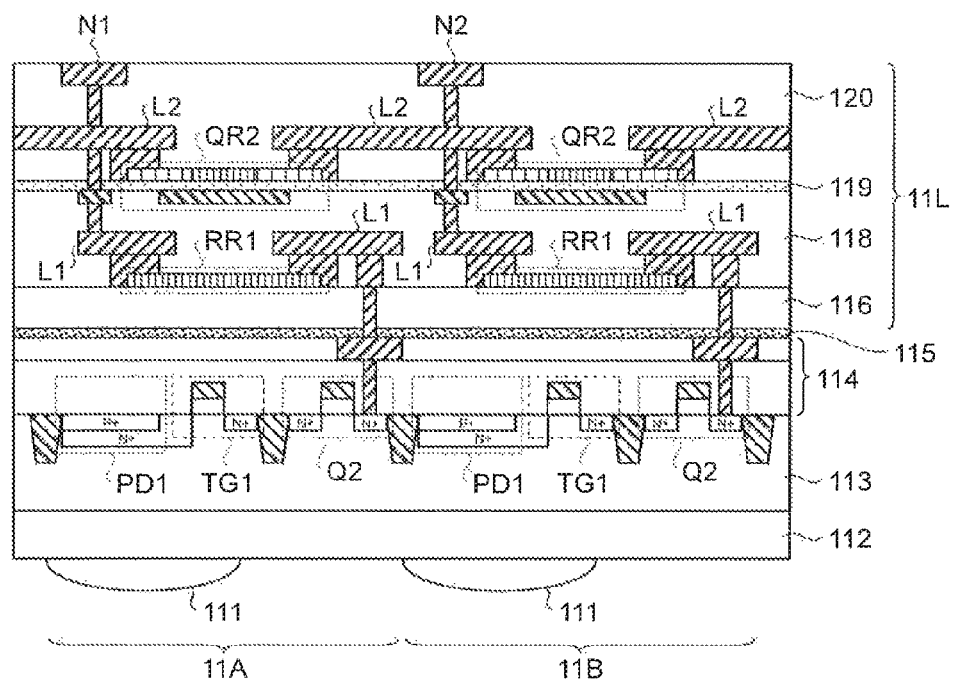
FIG. 11 is a view illustrating a cross-sectional structure example of a semiconductor apparatus according to the second embodiment.

In FIG. 11, a cross-sectional structure example of a semiconductor apparatus to realize the circuit configuration illustrated in FIG. 10 is illustrated. Note that similarly to FIG. 4, a reset transistor Q1 and a switching transistor Q3 in an amplifier circuit lie are omitted in FIG. 11. Also, in FIG. 11, a rear surface irradiation-type semiconductor apparatus is illustrated but this is not the limitation. A surface irradiation-type semiconductor apparatus may be used.

As it is obvious from comparison between FIG. 11 and FIG. 4, in the second embodiment, a configuration in which a gate insulation film 117 on a lower layer side in a wiring line layer 11L is omitted and a non-variable resistance element RR1 is formed on an interlayer insulation film 116 instead of the MOS transistor QR1 is included. The non-variable resistance element RR1 is, for example, a semiconductor layer. The semiconductor layer may be an oxide semiconductor such as InGaZnO or may be Poly-Si, amorphous Si, SiGe, or the like. Also, an oxygen defect region or an impurity region may be provided on a whole semiconductor layer.

As described above, according to the second embodiment, similarly to the above-described embodiment, smoothing processing of image data can be performed by analog processing at high speed without increasing a pixel area. Also, in a case where a silicon retina chip is used, an imaging element including a basic processing function necessary for image recognition can be realized without substantially changing a pixel layout of a pixel array 11.

Moreover, in the second embodiment, a non-variable resistance element with a simple structure is used as either of the variable resistance elements VR1 and VR2. Thus, it is possible to reduce the number of processes in production.

Note that since a configuration, a production method, and an effect of each of a different imaging element, imaging apparatus, and semiconductor apparatus are similar to those of the described embodiment, a detail description thereof is omitted here.

Third Embodiment

Then, an imaging element, an imaging apparatus, and a semiconductor apparatus according to the third embodiment will be described in detail with reference to the drawings.

Figure 12:
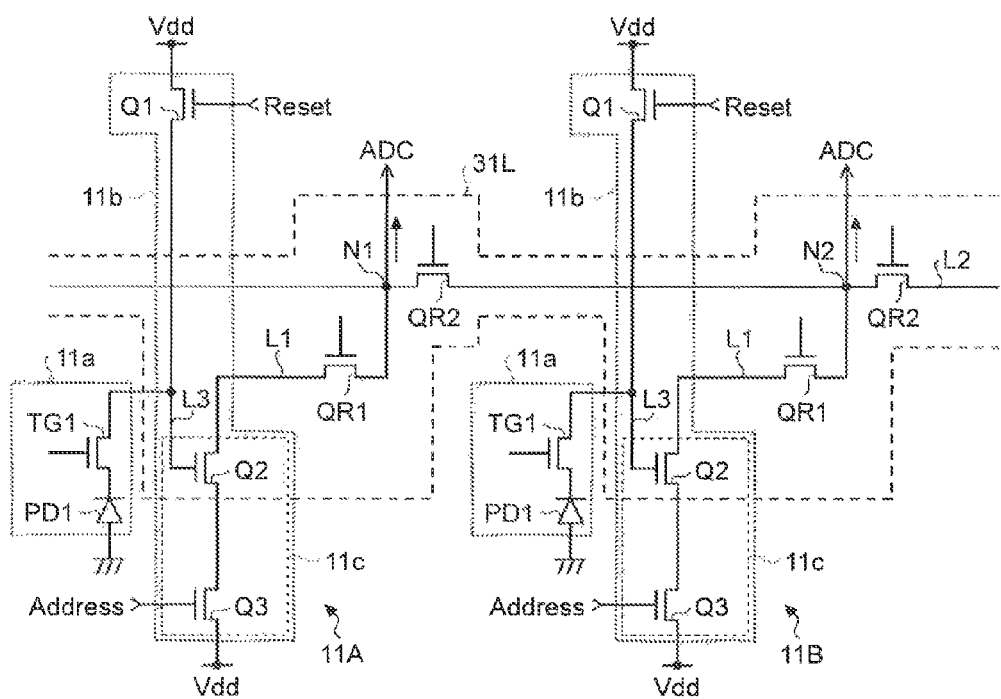
FIG. 12 is a circuit diagram illustrating a schematic configuration example of an imaging element according to a third embodiment.

FIG. 12 is a circuit diagram illustrating a schematic configuration example of the imaging element according to the third embodiment. As it is obvious from comparison between FIG. 12 and FIG. 3, the third embodiment includes a circuit configuration similar to that of the first embodiment. However, in the third embodiment, an amplifier transistor Q2 in an amplifier circuit 11c is provided in a wiring line layer 31L corresponding to the wiring line layer 11L.

Figure 13:
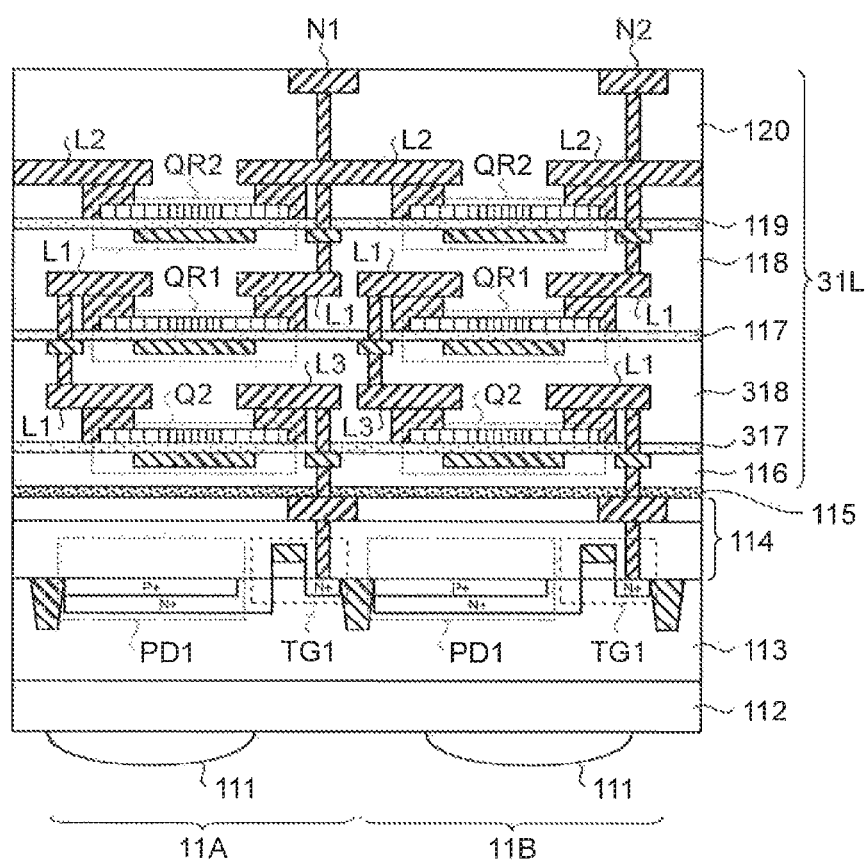
FIG. 13 is a view illustrating a cross-sectional structure example of a semiconductor apparatus according to the third embodiment.

In FIG. 13, a cross-sectional structure example of a semiconductor apparatus to realize the circuit configuration illustrated in FIG. 12 is illustrated. Note that similarly to FIG. 4, a reset transistor Q1 and a switching transistor Q3 in an amplifier circuit 11c are omitted in FIG. 13. Also, in FIG. 13, a rear surface irradiation-type semiconductor apparatus is illustrated but this is not the limitation. A surface irradiation-type semiconductor apparatus may be used.

As it is obvious from comparison between FIG. 13 and FIG. 4, in the third embodiment, a gate insulation film 317 and an interlayer insulation film 318 are provided between an interlayer insulation film 116 and a gate insulation film 117. The amplifier transistor Q2 is formed in such a manner as to sandwich the gate insulation film 317. Also, in each of a contact layer 114, a diffusion prevention film 115, the interlayer insulation film 116, the gate insulation film 317, and the interlayer insulation film 318, a connection wiring line L3 to connect a transfer gate TG1 and the amplifier transistor Q2 is formed. The other configuration may be similar to that of the semiconductor apparatus illustrated in FIG. 4.

As described above, according to the third embodiment, similarly to the above-described embodiments, smoothing processing of image data can be performed by analog processing at high speed without increasing a pixel area. Also, in a case where a silicon retina chip is used, an imaging element including a basic processing function necessary for image recognition can be realized without substantially changing a pixel layout oil a pixel array 11.

Moreover, in the third embodiment, since the amplifier transistor Q2 is provided in the wiring line layer 31L, a pixel area can be reduced. Alternatively, it becomes possible to increase a light receiving area of a photodiode PD1 while keeping pixel area and to improve pixel sensitivity or the number of saturation electrons.

Note that since a configuration, a production method, and an effect of each of a different imaging element, imaging apparatus, and semiconductor apparatus are similar to those of the described embodiment, a detail description thereof is omitted here.

Fourth Embodiment

Then, an imaging element, an imaging apparatus, and a semiconductor apparatus according to the fourth embodiment will be described in detail with reference to the drawings.

In the above-described first embodiment, the MOS transistors Q2 and Q3 are used as the variable resistance elements VR1 and VR2. However, this is not the limitation. For example, as the variable resistance elements VR1 and VR2, a resistive memory (ReRAM), a phase change RAM (PRAM), a magnetoresistive RAM (MRAM), amorphous Si, Poly-Si, or a laminated structure of these materials and metal can be used.

Figure 14:
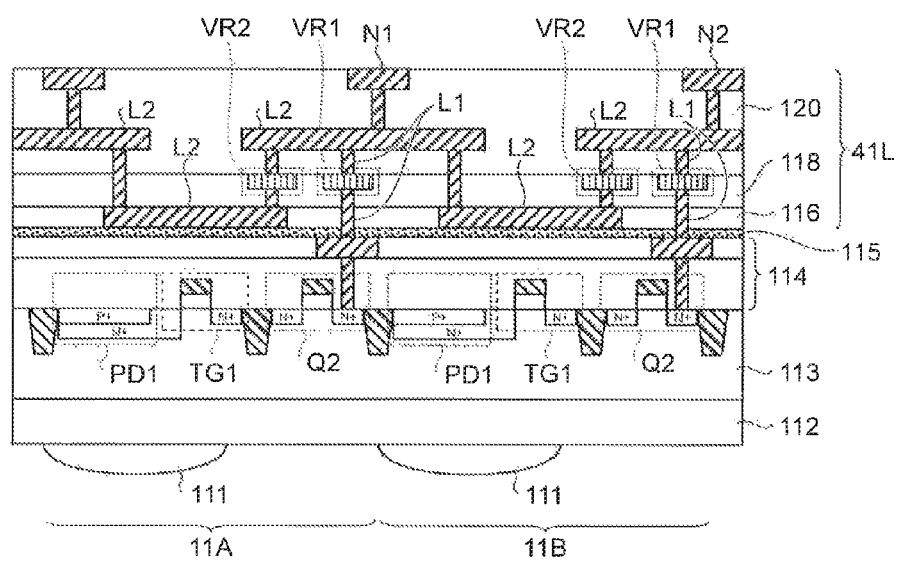
FIG. 14 is a view illustrating a cross-sectional structure example of a semiconductor apparatus according to a fourth embodiment.

In FIG. 14, a cross-sectional, structure example of a semiconductor apparatus to realize a circuit configuration of an imaging element according to the fourth embodiment is illustrated. Note that similarly to FIG. 4, a reset transistor Q1 and a switching transistor Q3 in an amplifier circuit lie are also omitted in FIG. 14. Also, in FIG. 14, a rear surface irradiation-type semiconductor apparatus is illustrated but this is not the limitation. A surface irradiation-type semiconductor apparatus may be used.

As it is obvious from comparison between FIG. 14 and FIG. 4, in the fourth embodiment, a configuration in which gate insulation films 117 and 119 in a wiring line layer 41L corresponding to the wiring line layer 11L are omitted and variable resistance elements VR1 and VR2 are formed in an interlayer insulation film 118 is included.

As described above, according to the fourth embodiment, similarly to the above-described embodiments, smoothing processing of image data can be performed by analog processing at high speed without increasing a pixel area. Also, in a case where a silicon retina chip is used, an imaging element including a basic processing function necessary for image recognition can be realized without substantially changing a pixel layout of a pixel array 11.

Note that since a configuration, a production method, and an effect of each of a different imaging element, imaging apparatus, and semiconductor apparatus are similar to those of the described embodiment, a detail description thereof is omitted here.

Fifth Embodiment

Then, an imaging element, an imaging apparatus, and a semiconductor apparatus according to the fifth embodiment will be described in detail with reference to the drawings.

Figure 15:
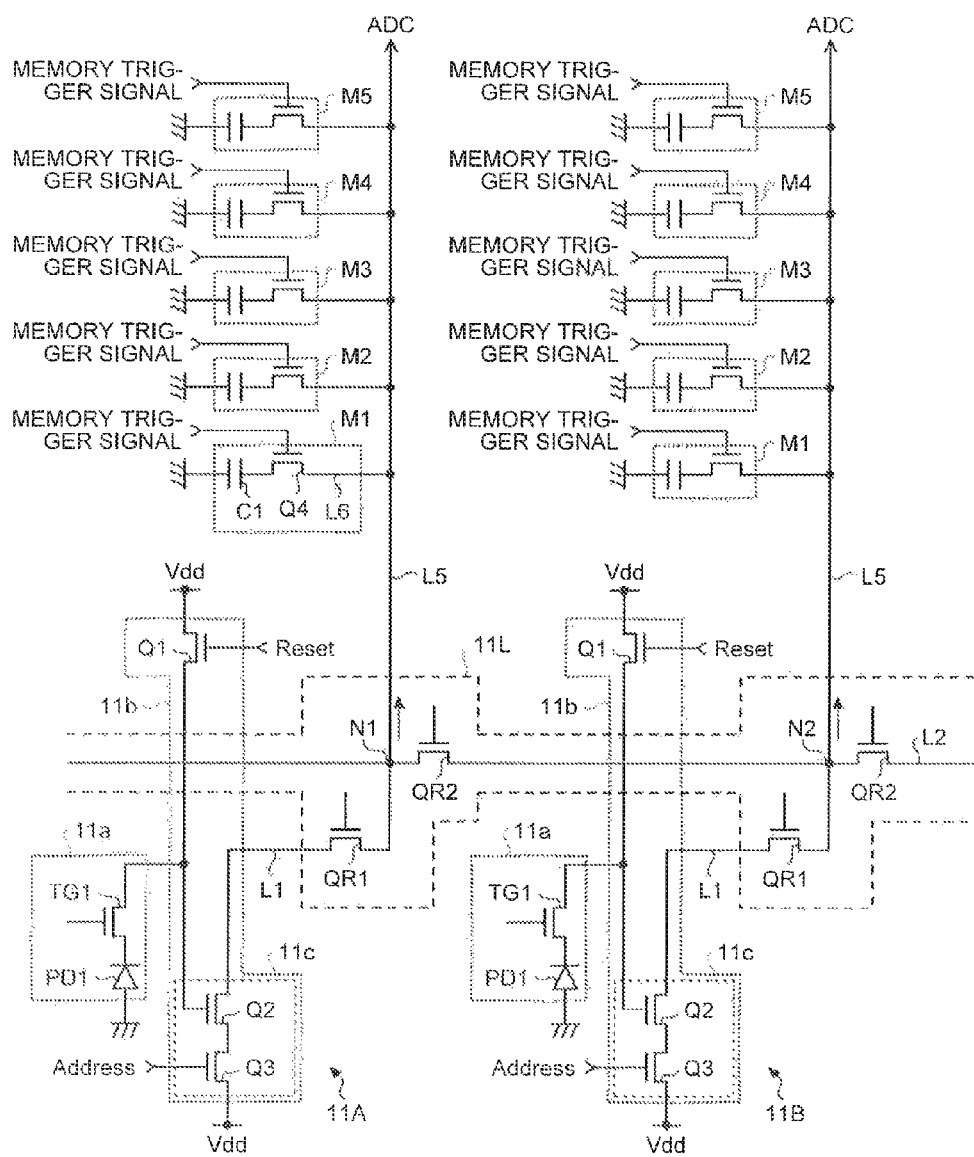
FIG. 15 is a circuit diagram illustrating a schematic configuration example of an imaging element according to a fifth embodiment.

FIG. 15 is a circuit diagram illustrating a schematic configuration example of the imaging element according to the fifth embodiment. As it is obvious from comparison between FIG. 15 and FIG. 3, each of pixel cells 11A and 11B according to the fifth embodiment may include a circuit configuration similar to that of the first embodiment. However, in the fifth embodiment, one or more (five in FIG. 15) memory elements M1 to M5 are connected, through a second wiring line L6, to a first wiring line L5 connected to each of nodes N1 and N2. Note that a configuration of a pixel cell is not limited to the circuit configuration according to the first embodiment illustrated in FIG. 3 and may be a circuit configuration according to a different embodiment.

In the memory elements M1 to M5 connected to a certain node (here, it is assumed as node N1), pieces of pixel information (such as pixel value), which are smoothed in different resistance ratios R1/R2 (that is, different degree of smoothness) and are read from the pixel cell 11A, are respectively stored as pieces of analog data. For example, in the memory element M1, pixel information smoothed with the lowest smoothness is stored. In the memory element M2, pixel information smoothed with smoothness higher than that of the pixel information stored in the memory element M1 is stored. In the memory element M3, pixel information smoothed with smoothness higher than that of the pixel information stored in the memory element M2 is stored. In the memory element M4, pixel information smoothed with smoothness higher than that of the pixel information stored in the memory element M3 is stored. In the memory element M5, pixel information smoothed with the highest smoothness is stored. Thus, by serially reading pieces of pixel information from the memory elements M1 to M5 connected to each node, pieces of image data smoothed with different degrees of smoothness can be read. However, correspondences between degrees of smoothness and the memory elements M1 to M5 are not necessarily in the above-described order.

Each of the memory elements M1 to M5 includes, for example, a configuration in which a MOS transistor Q4 and a capacitor C1 are connected in series. However, this is not the limitation, for example, a variable resistance memory such as a ReRAM or a silicon-oxide-nitride-oxide-silicon (SONOS) memory can be used.

Then, an operation of an imaging element according to the fifth embodiment will be described. A charge corresponding to a light quantity value of incident light at certain time t is transferred from a photodiode PD1 to a charge accumulation region. As a result, source potential of an amplifier transistor Q2 becomes a value corresponding to the light quantity value. Thus, at the time t, with R1/R2<<1, image information with significantly low smoothness (substantially no smoothness) is stored in the memory element M1 in a first stage. Here, when a frame speed is normal and around 30 to 60 frames/second (FPS), each space between frames becomes 10 msec or more. Thus, resistance values of variable resistance elements VR1 and VR2 are changed between frames, whereby pieces of image information with different degrees of smoothness are respectively stored into the memory elements M2 to M5 in and after a second stage. Accordingly, a number of pieces of pixel information with different degrees of smoothness can be acquired in a short period of time. Note that into a gate of a MOS transistor Q4 in each of the memory elements M1 to M5, a memory trigger signal for writing pixel information from the photodiode PD1 is input at different timing corresponding to each timing of writing.

Note that a pixel value of when a reset transistor Q1 is on may be stored in any of the memory elements M1 to M5. In this case, by executing differential processing with image data acquired in a reset state as a base, it becomes possible to remove a low frequency noise component of the image data.

Figure 16:
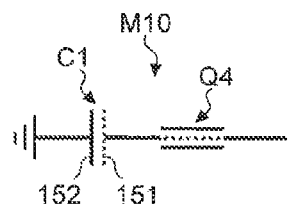
FIG. 16 is a circuit diagram illustrating a first example of a memory element according to the fifth embodiment.
Figure 17:
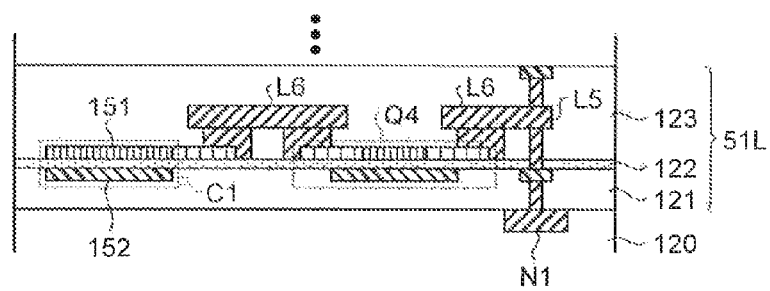
FIG. 17 is a cross-sectional view illustrating a structure example of the memory element illustrated in FIG. 16.
Figure 18:
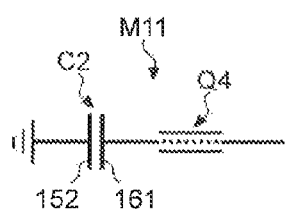
FIG. 18 is a circuit diagram illustrating a second example of the memory element according to the fifth embodiment.
Figure 19:
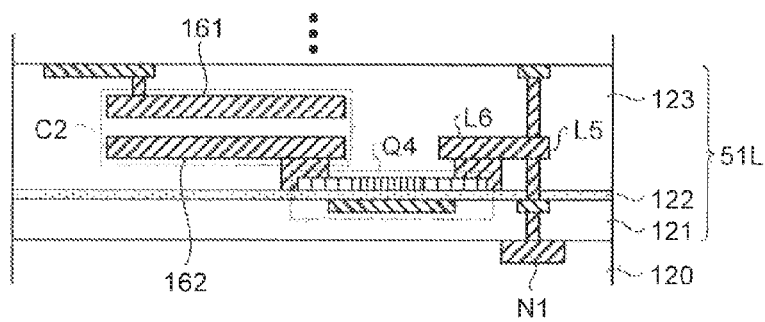
FIG. 19 is a cross-sectional view illustrating a structure example of the memory element illustrated in FIG. 18.

In FIG. 16 to FIG. 19, detail examples of the memory elements M1 to M5 according to the fifth embodiment are illustrated. FIG. 16 is a circuit diagram illustrating a first example of a memory element and FIG. 17 is a cross-sectional view illustrating a structure example of the memory element illustrated in FIG. 16. FIG. 18 is a circuit diagram illustrating a second example of a memory element and FIG. 19 is a cross-sectional view illustrating a structure example of the memory element illustrated in FIG. 13. Note that a memory element M10 illustrated in each of FIG. 16 to FIG. 19 may include a common structure with the memory elements M1 to M5.

As illustrated in FIG. 16 and FIG. 17, a structure of the MOS transistor Q4 in the memory element M10 according to the first example is similar to that of a wiring line layer transistor such as the above-described MOS transistors QR1 and QR2. Also, in a capacitor C1, one electrode 151 may include a semiconductor layer and the other electrode 152 may include a metal wiring line. Moreover, in a cross-sectional structure of the memory element M10 in each stage, for example, an interlayer insulation film 121, a gate insulation film 122, and an interlayer insulation film 123 are serially laminated on a passivation 120 (or interlayer insulation film 123 described later). Each of a MOS transistor Q4 and a capacitor C1 is formed in such a manner as to sandwich the gate insulation film 122. Thus, in a case where the memory element M10 has five stages (memory elements M1 to M5), the semiconductor apparatus includes a cross-sectional structure in which a structure of a wiring line layer 51L in FIG. 17 is laminated for five times in a laminate direction. Note that as the MOS transistor Q4, a transistor with a small off-leak current is preferably used in order to improve a memory retention characteristic. For example, a MOS transistor in which InGaZnO is used as a semiconductor layer may be used.

Also, in the first example, it is assumed that one electrode 151 of the capacitor C1 is a semiconductor layer but this is not the limitation. For example, as illustrated in a memory element M11 according to the second example illustrated in FIG. 18 and FIG. 19, both electrodes 161 and 162 of a capacitor C2 may be metal wiring lines. Similarly, in this case, when the memory element M11 has five stages (memory elements M1 to M5), the semiconductor apparatus includes a cross-sectional structure in which a structure of a wiring line layer 51L in FIG. 19 is laminated for five times in a laminate direction.

Note that it is assumed that the gate insulation film 122 is between the electrodes 151 and 152 of the capacitor C1 in the above-described first example and that a part of the interlayer insulation film 123 is between the electrodes 161 and 162 of the capacitor C2 in the second example. However, this is not the limitation. For example, by providing a dielectric film or the like between the electrodes 151 and 152, capacity of the capacitor C1 or C2 may be adjusted (increased or decreased).

As described above, according to the fifth embodiment, similarly to the above-described embodiments, smoothing processing of image data can be performed by analog processing at high speed without increasing a pixel area. Also, in a case where a silicon retina chip is used, an imaging element including a basic processing function necessary for image recognition can be realized without substantially changing a pixel layout of a pixel array 11.

Moreover, according to the fifth embodiment, a memory element is provided in a wiring line layer and pieces of image data smoothed with different degrees of smoothness are stored into a memory array including this. Thus, it becomes possible to acquire a number of images with different degrees of smoothness in a short period of time.

Note that since a configuration, a production method, and an effect of each of a different imaging element, imaging apparatus, and semiconductor apparatus are similar to those of the described embodiment, a detail description thereof is omitted here.

Sixth Embodiment

Then, an imaging element, an imaging apparatus, and a semiconductor apparatus according to the sixth embodiment will be described in detail with reference to the drawings.

In the above-described fifth embodiment, a memory trigger signal for pixel information writing is input into a gate of the MOS transistor Q4 at different timing corresponding to timing of writing into each of the memory elements M1 to M5. However, as described above, a frame speed to determine timing of writing pixel information into each of the memory elements M1 to M5 is constant. Thus, in the sixth embodiment, by delaying one memory trigger signal, timing of writing into the memory elements M1 to M5 becomes different from each other.

Figure 20:
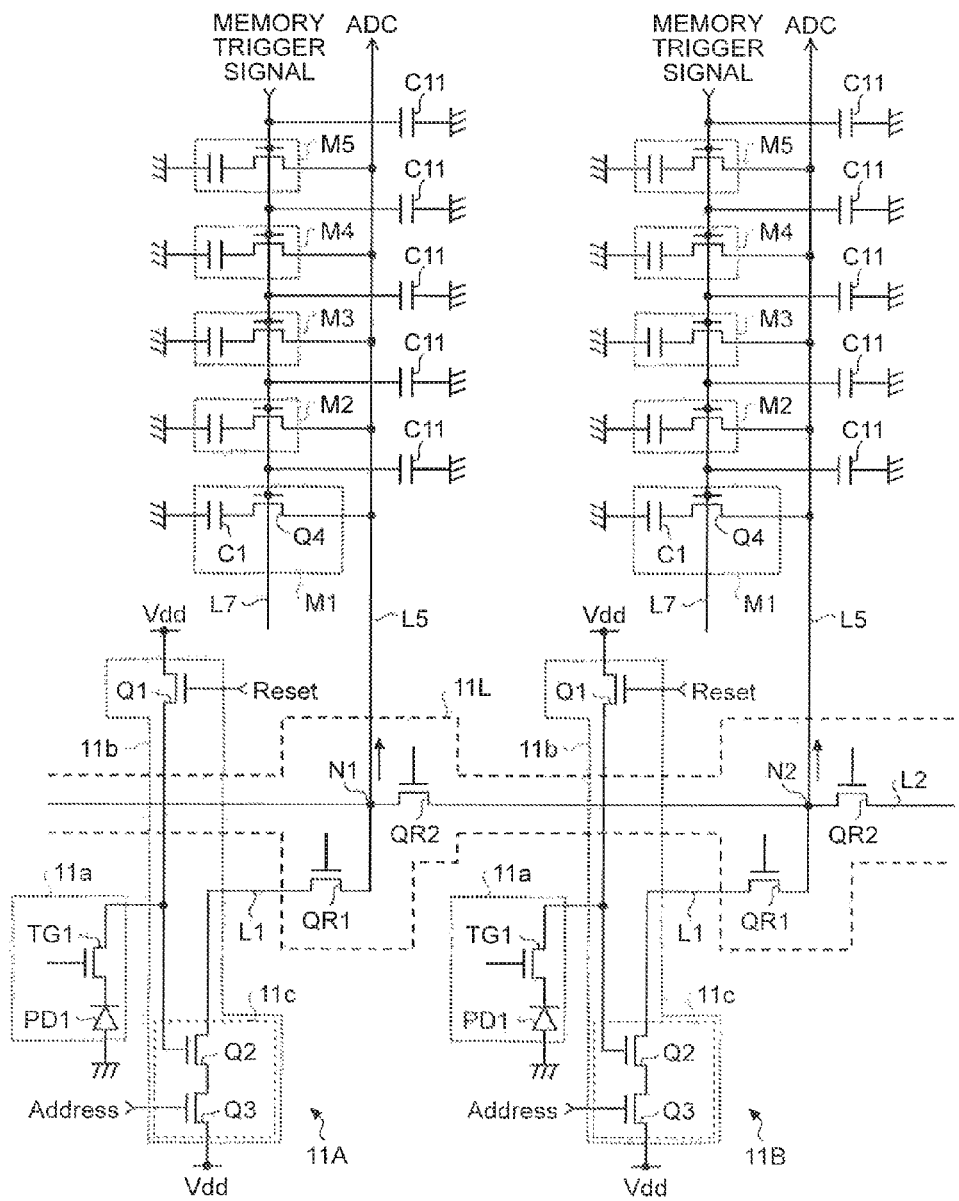
FIG. 20 is a circuit diagram illustrating a schematic configuration example of an imaging element according to a sixth embodiment.

FIG. 20 is a circuit diagram illustrating a schematic configuration example of an imaging element according to the sixth embodiment. As it is obvious from comparison between FIG. 20 and FIG. 15, in the sixth embodiment, a common memory trigger signal is input into a gate of a MOS transistor Q4 in each of memory elements M1 to M5. However, in a wiring line L7 where the memory trigger signal propagates, a delay capacitor C11 to delay the memory trigger signal is connected in each stage in front of a gate of the MOS transistor Q4 in each of the memory elements M1 to M5. Accordingly, the memory trigger signal is delayed for a certain period of time, and thus, on/of operation of the MOS transistor Q4 in each of the memory elements M1 to M5 is deviated for the certain period of time. Then, by performing control in such a manner that a resistance ratio R1/R2 is changed according to a period of delay time, it becomes possible to store pieces of pixel information with different degrees of smoothness into the memory elements M1 to M5 by outputting a memory trigger signal once. Also, similarly, in reading of pixel information, it becomes possible to read the pieces of image information held in the memory elements M1 to M5 by outputting a memory trigger signal once.

Note that a buffer or the like can be also used instead of the delay capacitor C11. However, normally, the delay capacitor C11 is preferably used since the delay capacitor C11 has an advantage in area.

As described above, according to the sixth embodiment, similarly to the above-described embodiments, smoothing processing of image data can be performed by analog processing at high speed without increasing a pixel area. Also, in a case where a silicon retina chip is used, an imaging element including a basic processing function necessary for image recognition can be realized without substantially changing a pixel layout of a pixel array 11.

Moreover, according to the sixth embodiment, similarly to the fifth embodiment, a number of images with different degrees of smoothness can be acquired in a short period, of time. Also, according to the sixth embodiment, writing/reading with respect to the memory elements M1 to M5 can be performed by outputting a memory trigger signal once.

Note that since a configuration, a production method, and an effect of each of a different imaging element, imaging apparatus, and semiconductor apparatus are similar to those of the described embodiment, a detail description thereof is omitted here.

Seventh Embodiment

Then, examples of an imaging apparatus including an imaging element according to each of the above-described embodiments will foe described in detail with reference to the drawings.

First Example

Figure 21:
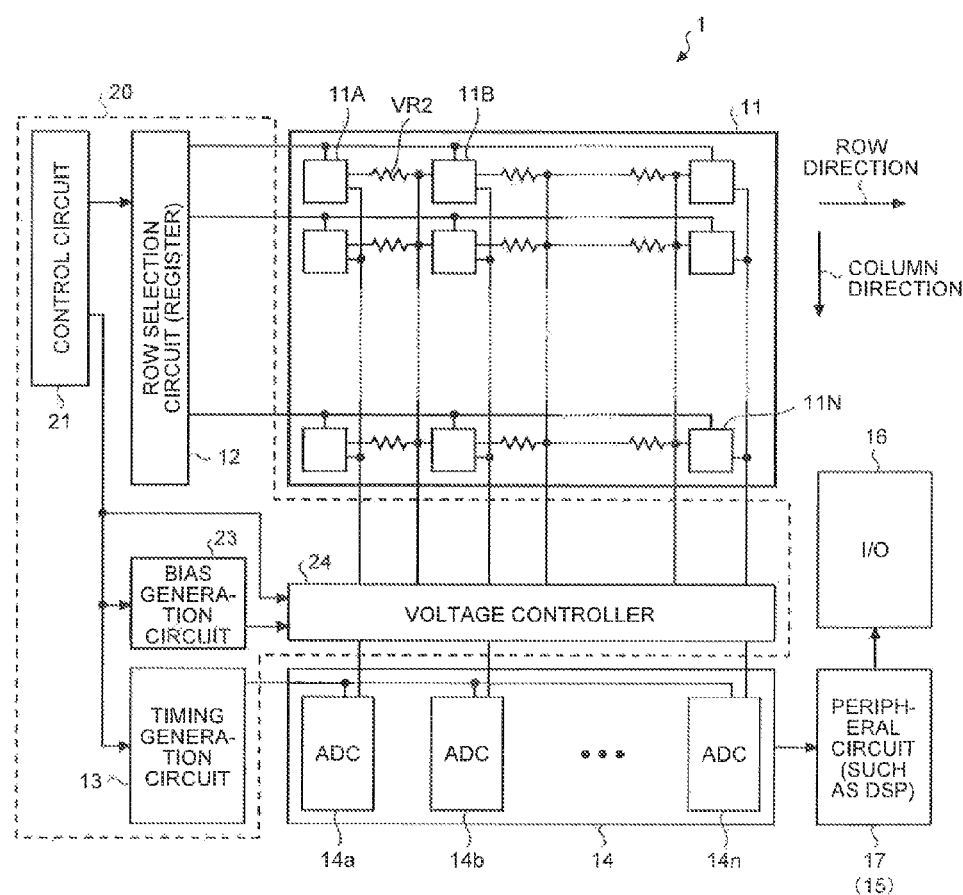
FIG. 21 is a circuit block diagram illustrating a first example of an imaging apparatus according to a seventh embodiment.

First, a case where pixel cells arrayed in a horizontal direction is connected to each other through a variable resistance element will be described as the first example. FIG. 21 is a circuit block diagram illustrating a schematic configuration of a CMOS image sensor which is an imaging apparatus according to the first example of the seventh embodiment. Note that FIG. 21 is a view illustrating the imaging apparatus 1 illustrated in FIG. 1 is illustrated in more detail.

As illustrated in FIG. 21, the imaging apparatus 1 according to the first example includes a pixel array 11, an ADC 14, a peripheral circuit 17 including a DSP 15, an I/O 16, and a controller 20.

The pixel array 11 includes a configuration in which a plurality of pixel cells 11A are 11N arrayed two-dimensionally. The pixel cells 11A to 11N are connected to each other through a variable resistance element VR2 provided in a wiring line layer 11L. In the example illustrated in FIG. 21, the variable resistance elements VR2 are respectively provided between the pixel cells 11A to 11N arrayed in a row direction.

The controller 20 includes a row selection circuit (register) 12, a timing generation circuit 13, a bias generation circuit 23, a voltage controller 24, and a control circuit 21. The control circuit 21 controls an operation of the bias generation circuit 23, the voltage controller 24, the row selection circuit 12, and the timing generation circuit 13. The row selection circuit 12 selects a row (horizontal line) of pixel cells 11A to 11N to be objects of reading and controls reading of a pixel signal from each of the plurality of pixel cells 11A to 11N in one horizontal line. The voltage controller 24 controls voltage of a vertical output signal line and a gate voltage applied to the variable resistance element VR2 for smoothing. However, the gate voltage control for smoothing may be performed by the row selection circuit 12 or by a voltage control circuit provided specially for the variable resistance element VR2.

The ADC 14 includes ADC blocks 14a to 14n in each vertical output signal line. Each of the ADC blocks 14a to 14n performs AD conversion of a voltage value (pixel signal) read from a corresponding vertical output signal line. Digital signal processing of the AD-converted pixel signal is performed, for example, by a DSP 15 in a peripheral circuit 17. Differential processing of images with different degrees of smoothness, maximum value/minimum value extraction processing, or the like is executed, for example, in the DSP 15. Also, the DSP 15 may execute feature amount extraction processing of gradient information or the like of an image value around a feature point. Then, an image signal processed in the peripheral circuit 17 is output from the I/O 16.

Second Example

Figure 22:
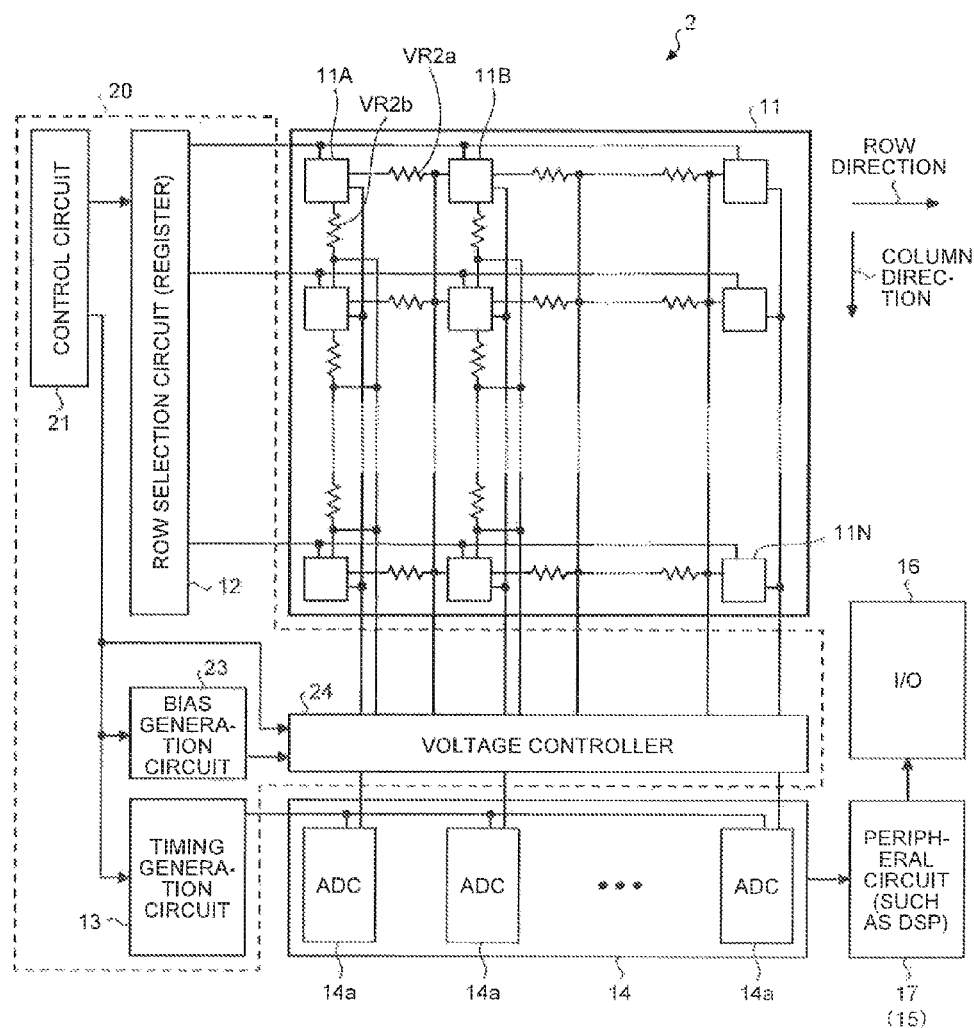
FIG. 22 is a circuit block diagram illustrating a second example of the imaging apparatus according to the seventh embodiment.

Then, a case where pixel cells arrayed in two dimensional directions, which are a horizontal direction and a vertical direction, are connected to each other through a variable resistance element will be described as the second example. FIG. 22 is a circuit block diagram illustrating a schematic configuration of a CMOS image sensor as an imaging apparatus according to the second example of the seventh embodiment. As illustrated in FIG. 22, an imaging apparatus 2 according to the second example includes a configuration similar to that of the imaging apparatus 1 illustrated in FIG. 21. However, in the pixel array 11, pixel cells 11A to 11N arrayed in two-dimensional directions, which are a horizontal direction and a vertical direction, are connected to each other through a variable resistance element VR2a or VR2b. A gate voltage applied to the variable resistance elements VR2a and VR2b for smoothing is controlled by a voltage controller 24. However, this is not the limitation. The control may be performed by a row selection circuit 12 or by a voltage control circuit provided specially for each of the variable resistance elements VR2a and VR2b.

Third Example

Figure 23:
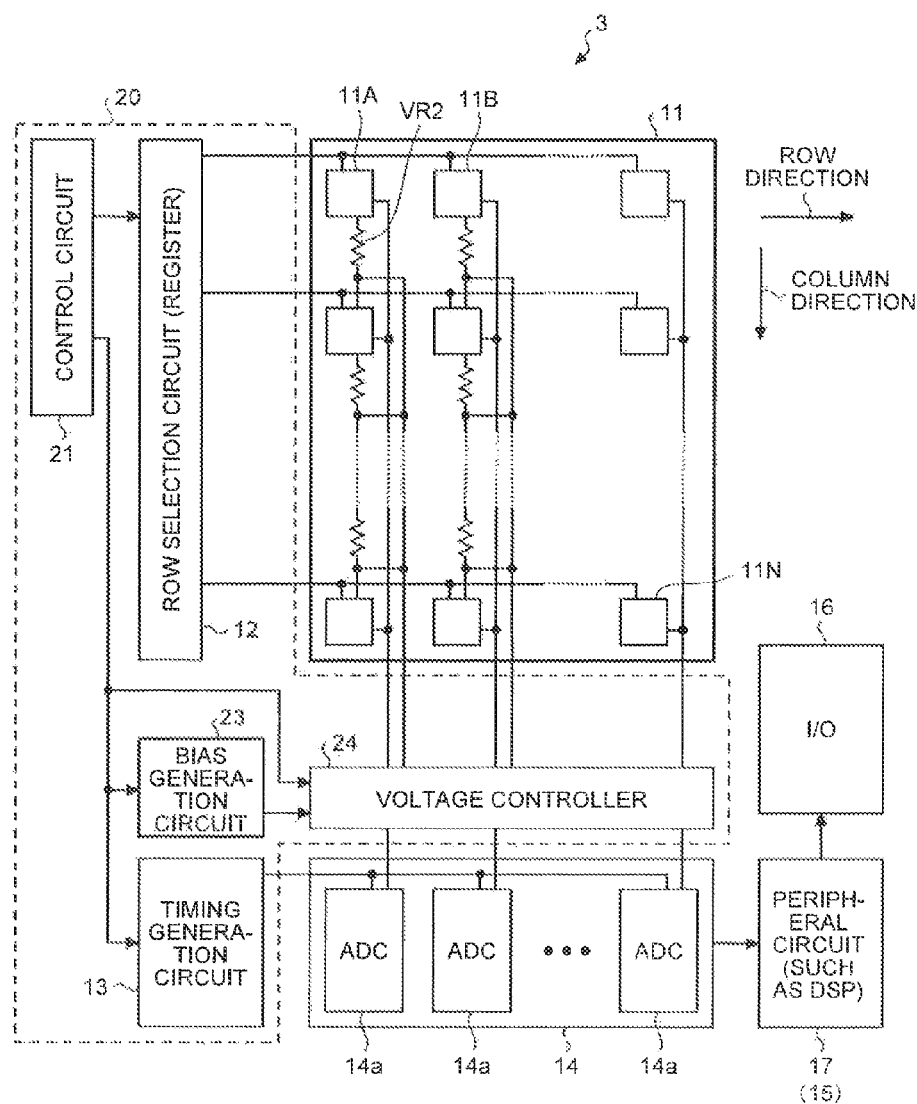
FIG. 23 is a circuit block diagram illustrating a third example of the imaging apparatus according to the seventh embodiment.

Then, a case where pixel cells arrayed in a vertical direction are connected to each other through a variable resistance element will be described as the third example. FIG. 23 is a circuit block diagram illustrating a schematic configuration of a CMOS image sensor as an imaging apparatus according to the third example of the seventh embodiment. As illustrated in FIG. 23, an imaging apparatus 3 according to the third example includes a configuration similar to that of the imaging apparatus 1 illustrated in FIG. 21. However, in a pixel array 11, pixel cells 11A to 11N arrayed in a vertical direction are connected to each other through a variable resistance element VR2. A gate voltage applied to the variable resistance element VR2 for smoothing is controlled by a voltage controller 24. However, this is not the example. The control may be performed by a row selection circuit 12 or by a voltage control circuit provided specially for the variable resistance element VR2.

Eighth Embodiment

Figure 24:
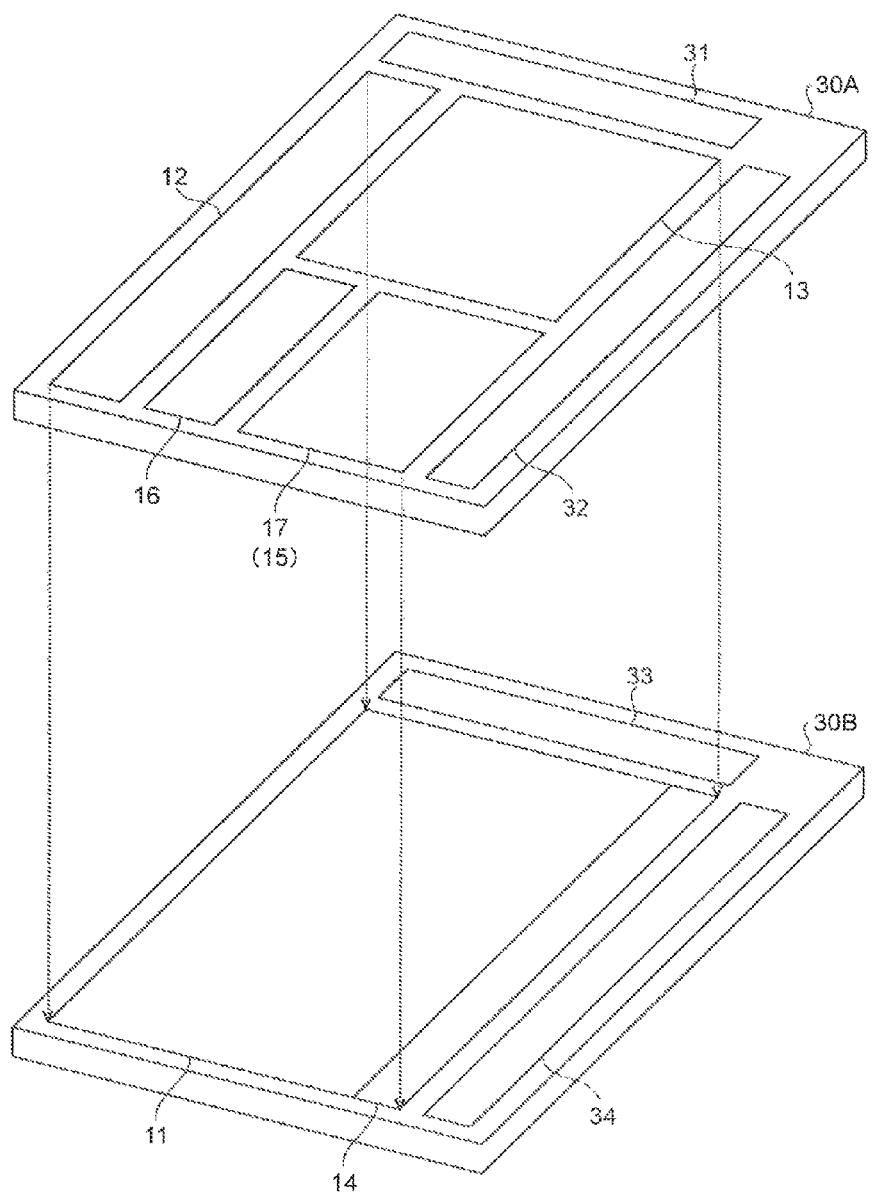
FIG. 24 is an overhead view illustrating a structure example of a CMOS image sensor chip according to an eighth embodiment.

Also, a structure of a CMOS image sensor chip illustrated as an example in each of the above-described embodiments may include a laminated structure in which two chips 30A and 30B are attached to each other, as illustrated in FIG. 24. Here, the laminated structure is a laminated structure of through silicon vias (TSV) 31 to 34 and a peripheral circuit 17 is arranged on a pixel array 11 in a layout, whereby area of the peripheral circuit 17 can be increased. As a result, it becomes possible to include a large-scale peripheral circuit 17 and to execute processing such as feature point extraction or feature amount extraction at higher speed.

Ninth Embodiment

Next, an embodiment of when a variable resistance element VR11 in which a resistance value is changed by switching resistance element arrays in multiple stages having different resistance values is used as a variable resistance element VR1 will be described in detail with reference to the drawings. Note that in the following embodiment, the variable resistance element VR11 may be applied to a variable resistance element VR2 or the variable resistance element VR11 may be applied to each of the variable resistance elements VR1 and VR2.

Figure 25:
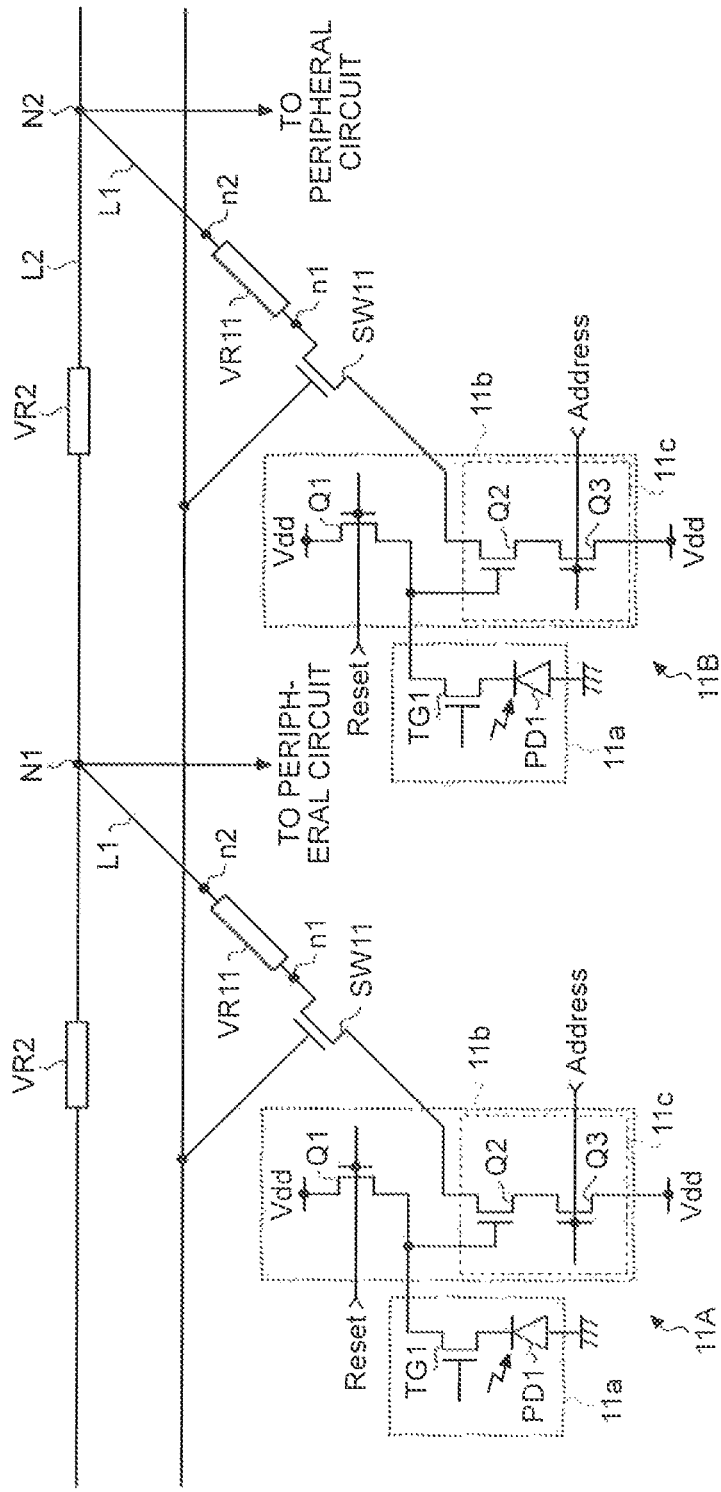
FIG. 25 is an overhead view illustrating a schematic configuration of an imaging apparatus according to a ninth embodiment.

FIG. 25 is an overhead view illustrating a schematic configuration of an imaging apparatus according to the ninth embodiment. Note that in FIG. 25, to a configuration similar to that of FIG. 1, the same reference sign is assigned and an overlapped description thereof is omitted. In the configuration illustrated in FIG. 25, the variable resistance element VR1 in FIG. 1 is replaced by the variable resistance element VR11 and a switching transistor SW11 connected to the variable resistance element VR1 in series is provided on each second wiring line L1 branches from a first wiring line L2. Each switching transistor SW11 is a transistor to switch a pixel cell 11A to be an object of writing/reading. Note that the switching transistor SW11 may be electrically provided between the variable resistance element VR1 and a node N1 (N2) or may be electrically provided between the variable resistance element VR1 and the pixel cell 11A (11B).

Figure 26:
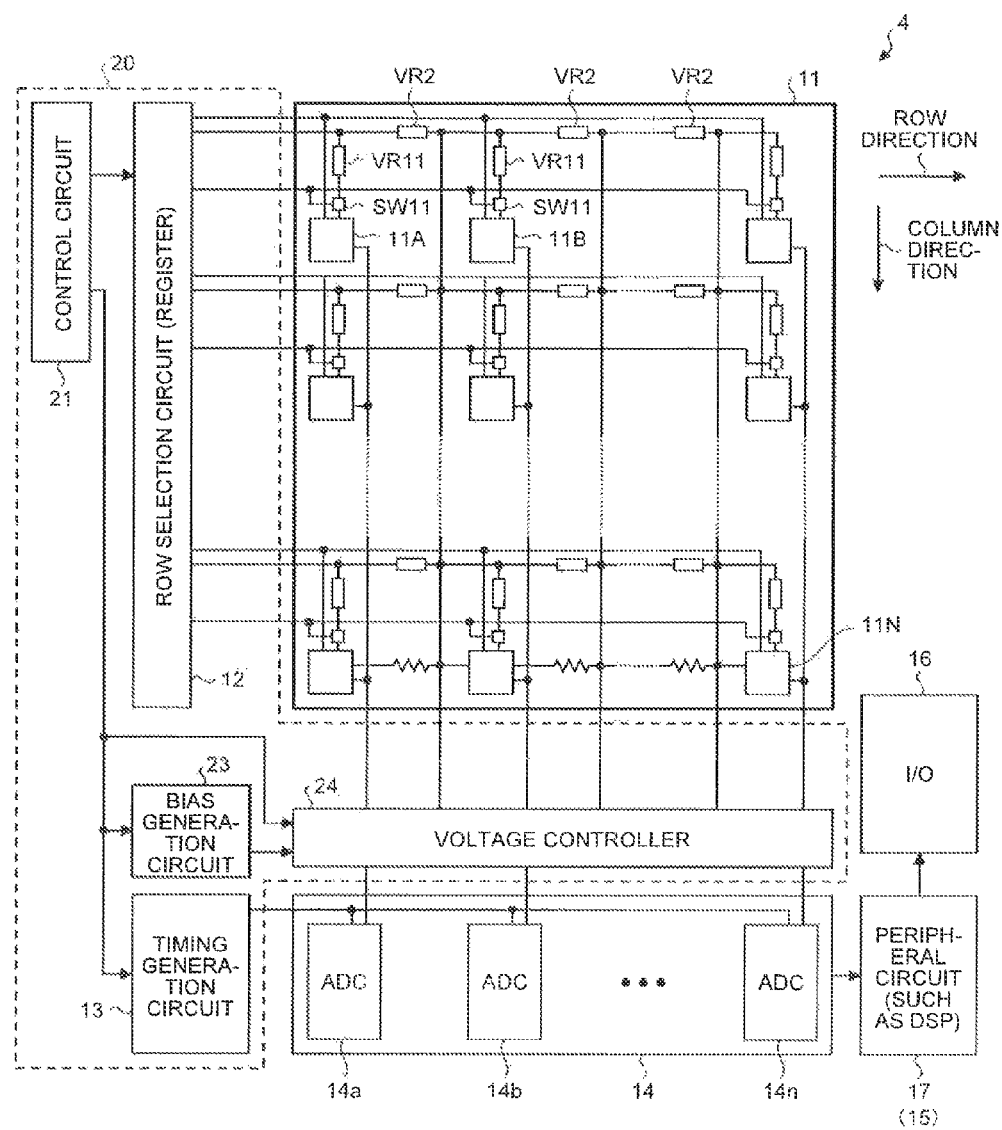
FIG. 26 is a circuit block diagram illustrating a schematic configuration of a CMOS image sensor as the imaging apparatus according to the ninth embodiment.

FIG. 26 is a circuit block diagram illustrating a schematic configuration of a CMOS image sensor as an imaging apparatus according to the ninth embodiment. As illustrated in FIG. 26, an imaging apparatus 4 includes a configuration similar to that of the imaging apparatus 1 illustrated in FIG. 21. In the configuration, a variable resistance element VR1 is replaced by a variable resistance element VR11 and a switching transistor SW11 is connected between each variable resistance element VR11 and each of pixel cells 11A to 11N. Note that in FIG. 21, the variable resistance element VR1 is omitted. A switch signal to the switching transistor SW11 is given, for example, by a row selection circuit 12. However, this is not the limitation. A switch signal may be input from a voltage controller 24 into the switching transistor SW11.

Figure 27:
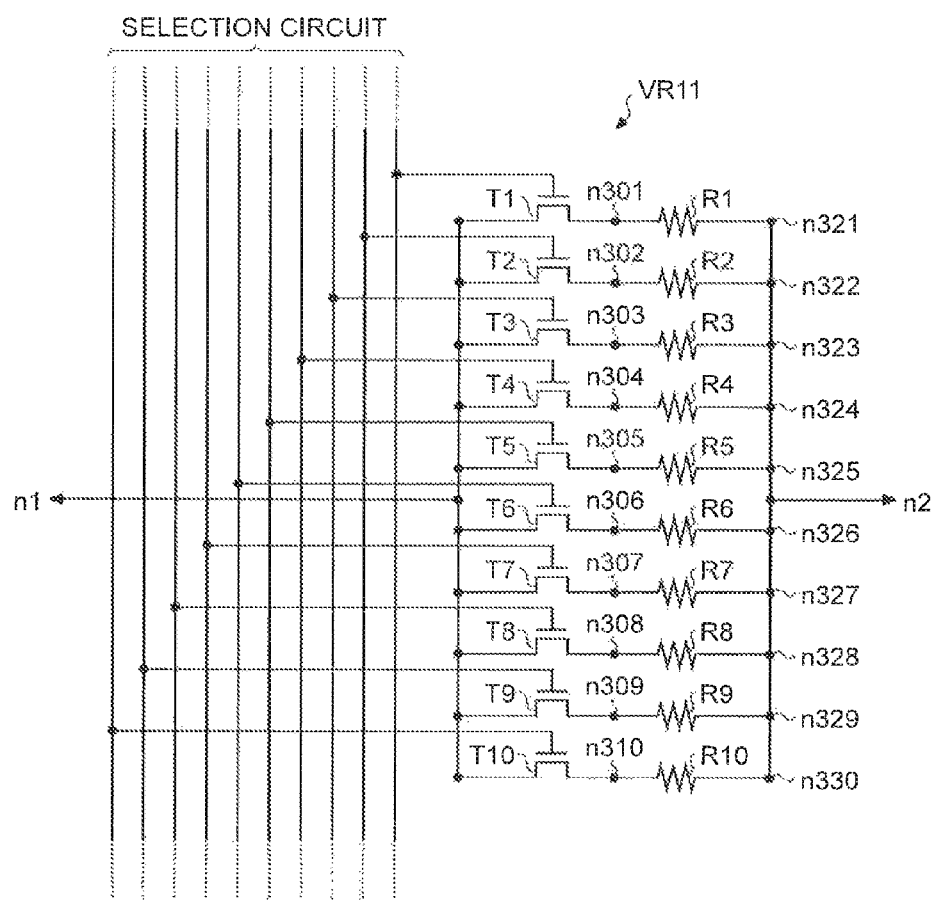
FIG. 27 is a circuit diagram illustrating an example of a variable resistance element according to the ninth embodiment.

FIG. 27 is a circuit diagram illustrating an example of a variable resistance element according to the ninth embodiment. As illustrated in FIG. 27, the variable resistance element VR11 includes a plurality of resistance elements R1 to R10 connected in parallel between nodes n1 and n2 in FIG. 25 and selection transistors T1 to T10 to respectively select the resistance elements R1 to R10.

Each of the resistance elements R1 to R10 includes, for example, a resistance element such as polysilicon resistance. When the resistance elements R1 to R10 are formed by polysilicon resistance in the same layer, a resistance value of each element is determined by a length in a wiring line direction and an area of a cross-sectional surface vertical to the wiring line direction. However, this is not the limitation. By making the resistance elements R1 to R10 include a uniform shape and by changing impurity concentration of each element, a resistance value thereof may be changed. Also, when both of the variable resistance elements VR1 and VR2 are respectively replaced by the variable resistance elements VR11, the number of parallel stages may be different from each other.

The selection transistors T1 to T10 are respectively connected to corresponding resistance elements R1 to R10 in series. To a gate of each of the selection transistors T1 to T10, a selection signal output from a selection circuit is applied. The selection circuit may be a row selection circuit 12 in FIG. 26, a voltage controller 24, or a selection circuit (not illustrated). A resistance value R1 (or R2) of the variable resistance element VR11 is determined by a resistance value of one or more of the resistance elements R1 to R10 connected to the selection transistors T1 to T10 which are brought into a conducting state by a selection signal.

Figure 28:
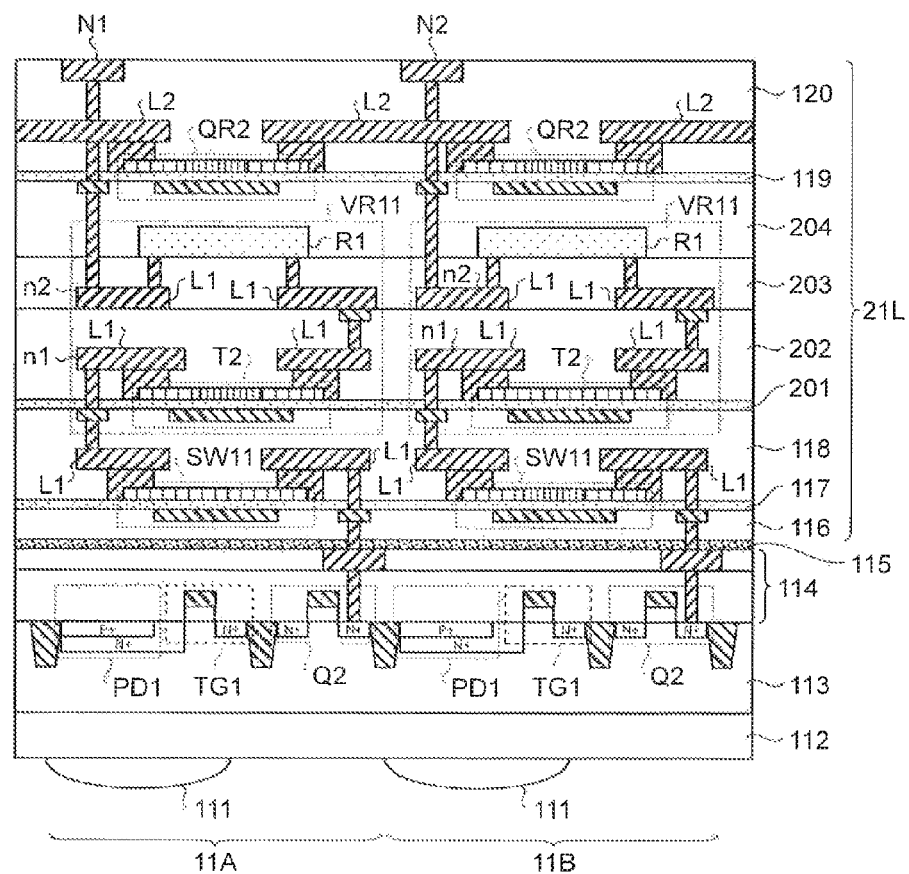
FIG. 28 is a view illustrating a cross-sectional structure example of a semiconductor apparatus to realize the circuit configuration illustrated in FIG. 25.

The selection transistors T1 to T10 are preferably provided in a wiring line layer in order to control an area increase in the pixel cell 11A. In FIG. 28, a cross-sectional structure example of a semiconductor apparatus to realize the circuit configuration illustrated in FIG. 25 is illustrated.

As illustrated in FIG. 28, in the ninth embodiment, in a configuration similar to that illustrated in FIG. 4, a gate insulation film 201 and interlayer insulation films 202 to 204 are additionally provided on an interlayer insulation film 118 in a wiring line layer 21L and a switching transistor SW11 is formed instead of the MOS transistor QR1 which is the variable resistance element VR1 formed on the interlayer insulation film 118. Also, on the interlayer insulation film 202, a selection transistor T1 in the variable resistance element VR11 is formed and on the interlayer insulation film 204 which is an upper layer thereof, a resistance element R1 in the variable resistance element VR11 is formed through a second wiring line L1 formed in the interlayer insulation film 203. Note that for convenience of description, in FIG. 28, a resistance element R1 in the variable resistance element VR11 and a selection transistor T1 connected thereto in series are illustrated. However, different resistance elements R2 to R10 and selection transistors T2 to T10 may be also formed in the same layer with the resistance element R1 and the selection transistor T1.

As described above, when a resistance element such as polysilicon resistance is used as the variable resistance element VR1 (VR2), compared to a case of using transistor resistance, it becomes possible to acquire a resistance value with less change with respect to a change in a bias between resistance elements. Also, by adjusting a cross-sectional area or a length of polysilicon resistance, it becomes possible to acquire an intended resistance value and to acquire the intended number of stages of smoothness according to the number of resistance element columns.

Note that the resistance elements R1 to R10 may be an insulation film, a dielectric film, or metal other than polysilicon resistance. Also, in FIG. 27, it is assumed that there are 10 columns of resistance elements bat there may be 10 or more columns or 10 or less columns. Moreover, in the configuration illustrated in FIG. 25, a switching transistor SW11 may be omitted depending on a configuration of the variable resistance element VR11. For example, when a variable resistance element VR11 illustrated in FIG. 27 is employed, selection transistors T1 to T10 may be used instead.

Tenth Embodiment

Figure 29:
FIG. 29 is a circuit diagram illustrating an example of a resistance element including a resistive memory according to a tenth embodiment.
Figure 30:
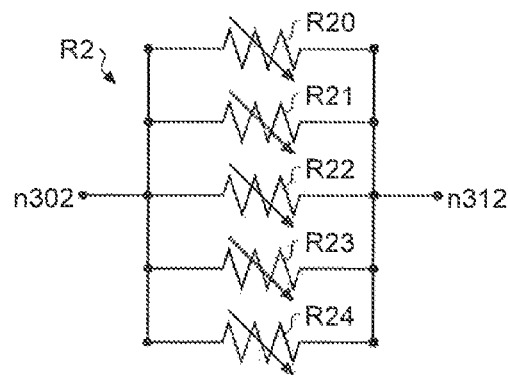
FIG. 30 is a circuit diagram illustrating a different example of a resistance element including the resistive memory according to the tenth embodiment.
Figure 31:
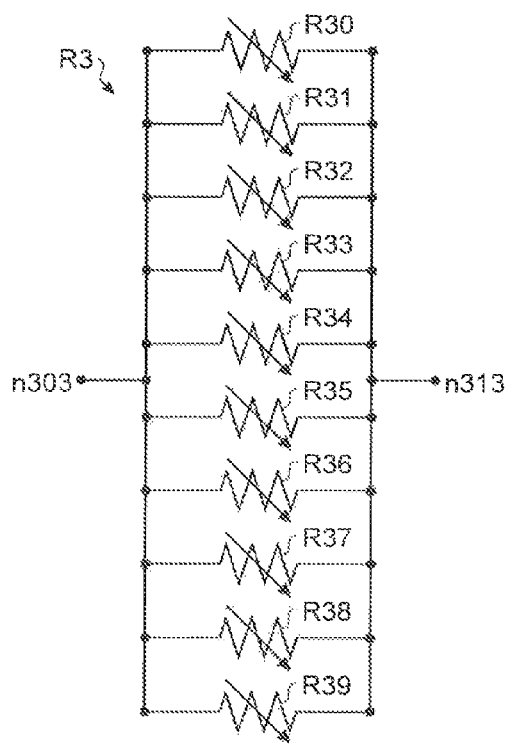
FIG. 31 is a circuit diagram illustrating a different example of a resistance element including the resistive memory according to one tenth embodiment.

Also, each of the resistance elements R1 to R10 in the ninth embodiment can include a resistive memory such as a ReRAM, an MRAM, a PRAM, an ion memory, an amorphous silicon memory, or a polysilicon memory. Each of FIG. 23 to FIG. 31 is a circuit diagram illustrating an example of a case where each of resistance elements R1 to R3 includes a resistive memory. Note that FIG. 29 is a view illustrating the resistance element R1, FIG. 30 is a view illustrating the resistance element R2, and FIG. 31 is a view illustrating the resistance element R3.

As illustrated in FIG. 29, for example, the resistance element R1 includes a single resistive memory R11. Also, the resistance elements R2 and R3 illustrated in FIG. 30 and FIG. 31 and resistance elements R4 to R10 respectively include resistive memories R20 to R24, R30 to R39, . . . connected in multi-stages in parallel. In such a manner, the number of resistive memories included in parallel in the resistance elements R1 to R10 may be changed according to a target resistance value.

Figure 32:
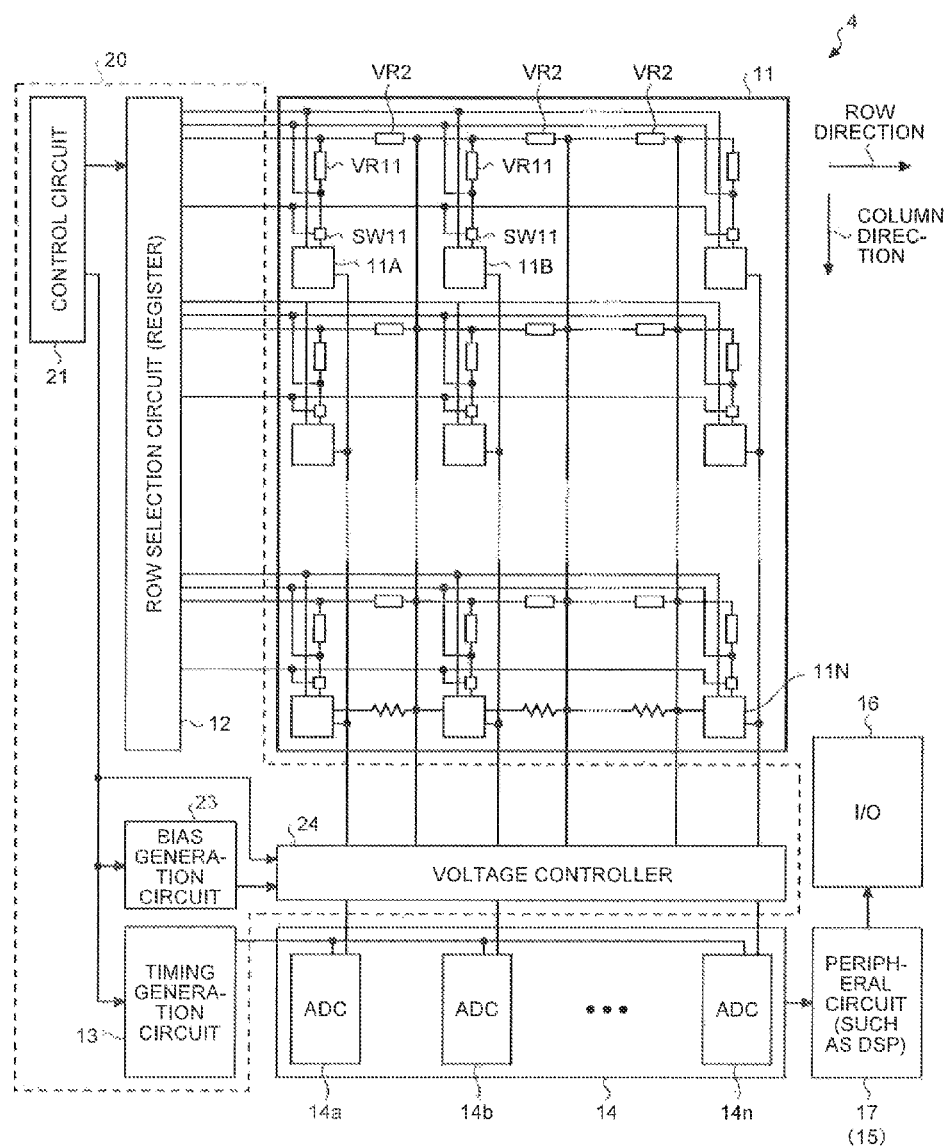
FIG. 32 is a circuit block diagram illustrating a schematic configuration of a CMOS image sensor as an imaging apparatus according to the tenth embodiment.

FIG. 32 is a circuit block diagram illustrating a schematic configuration of a CMOS image sensor as an imaging apparatus according to the tenth embodiment. As illustrated in FIG. 32, an imaging apparatus 5 includes a configuration similar to that of the imaging apparatus 4 illustrated in FIG. 26. In the configuration, a wiring line for writing which line is for writing a resistance value into a variable resistance element VR11 including resistive memories R11, R20 to R24, R30 to R39, . . . is additionally provided. The other configuration may be similar to that of the imaging apparatus 4 illustrated in FIG. 26.

Figure 33:
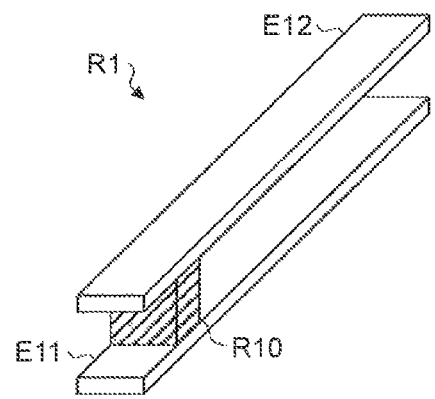
FIG. 33 is a view illustrating a structure example of a resistance element according to the tenth embodiment.
Figure 34:
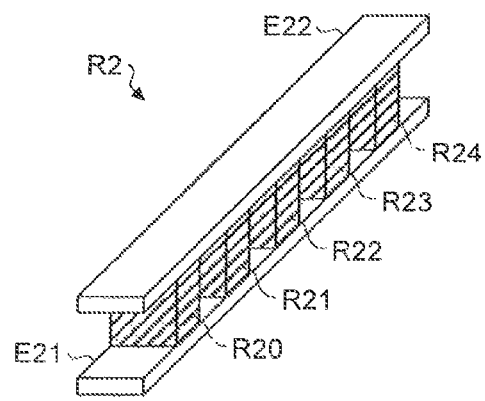
FIG. 34 is a view illustrating a different structure example of the resistance element according to the tenth embodiment.

FIG. 33 and FIG. 34 are views illustrating structure examples of the resistance elements R1 to R10. Note that FIG. 33 is a view illustrating a structure example of the resistance element R1 and FIG. 34 is a view illustrating a structure example of the resistance element R2. As illustrated in FIG. 33 and FIG. 34, the resistance element R1 includes two electrodes E11 and E12 arranged on an upper side and a lower side and the resistive memory R10 provided between the electrodes E11 and E12. Similarly, the resistance element R2 includes electrodes E21 and E22 and resistive memories R20 to R24 provided between the electrodes E21 and E22. Similarly, each of the other resistance elements R3 to R10 includes two electrodes and a plurality of resistive memories provided to the electrodes.

Figure 35:
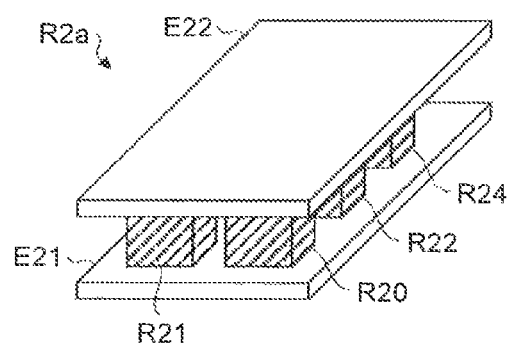
FIG. 35 is a view illustrating a different structure example of the resistance element according to the tenth embodiment.

In the resistance elements R2 to R10 each of which includes a plurality of resistive memories, the resistive memories are not necessarily arrayed in one line between electrodes and may be arrayed two-dimensionally as illustrated in FIG. 35. Moreover, in FIG. 33 and FIG. 34, the resistance elements R1 to R10 each of which has one layer structure are illustrated as examples. However, a multi-layer structure may be included. In this case, a rectifier element such as a diode may be provided between a resistive memory and an electrode. When the variable resistance element VR11 includes such a configuration, by arranging this on a wiring line layer 21L, it becomes possible to increase the number of stages of smoothness while controlling an area increase.

Writing of a resistance value into each of the resistance elements R1 to R10 is executed by applying a writing voltage to both ends of a resistance element, which includes a resistive memory, while keeping a switching transistor SW11 and a selection transistor turned on, the switching transistor SW11 being connected to a variable resistance element VR11 to be an object of writing and the selection transistor being connected to a resistance element to be an object of writing in the variable resistance element VR11. For example, when a resistance value is written into the resistance element R3 illustrated in FIG. 31, an intended resistance value is written into the resistance element R3 by applying an intended writing voltage to both ends of the resistance element R3 while keeping a switching transistor SW11, which is connected to a variable resistance element VR11 including the resistance element R3, and a selection transistor T3, which is connected to a resistance element R3, turned on.

Verify to verify a writing state may not be performed with respect to an individual variable resistance memory included in a resistance element but may be performed with respect to a whole resistance element to be an object of writing. Accordingly, even when a variable resistance memory included in a resistance element includes variation of an element or a defect of a part, it is possible to write an intended resistance value accurately while invalidating the variation of the element or the defect of the part during writing of the resistance value.

Also, writing of a resistance value into each of the resistance elements R1 to R10 may be performed during shipping from a factory or when an apparatus is in a waiting state (during standby period, idling period, or the like) or when power is off. Since resistance values written into the resistance elements R1 to R10 are kept even when power is turned off, it is not necessary to perform writing successively. This makes it possible to make each of the resistance elements R1 to R10 have a longer life and to perform high-speed switching of resistance values during an operation. However, this does not exclude, from an embodiment, successive writing of a resistance value.

A different configuration, effect, and operation are similar to those of the ninth embodiment and the other embodiments, and thus, a description thereof is omitted.

Eleventh Embodiment

In the tenth embodiment, a case where a two-terminal resistive memory is used as a resistance element has been described as an example. Instead, it is also possible to use a three-terminal resistive memory including two terminals for reading a resistance value and one terminal for writing a resistance value. By using the three-terminal resistive memory, a selection transistor for selecting an element in writing of a resistance value becomes unnecessary. Thus, it is possible to increase the number of variable resistance memories in parallel. As a result, it is possible to increase a change rate of a resistance value and to increase the number of stages of smoothness.

Figure 36:
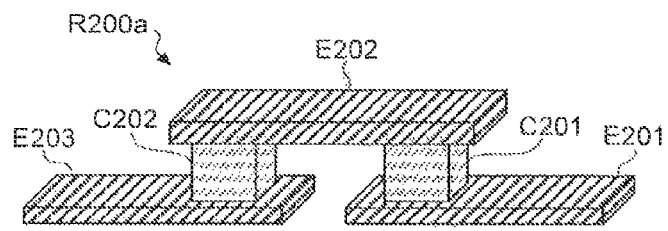
FIG. 36 is a view illustrating a structure example of a three-terminal variable resistance memory according to an eleventh embodiment.
Figure 37:
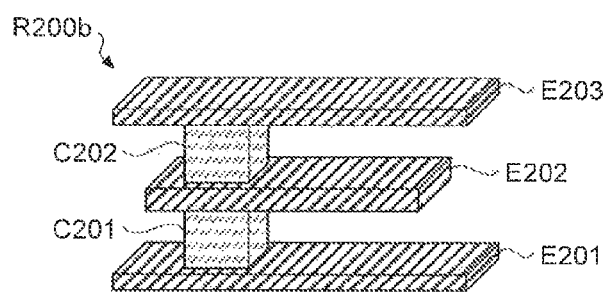
FIG. 37 is a view illustrating a different structure example of the three-terminal variable resistance memory according to the eleventh embodiment.
Figure 38:
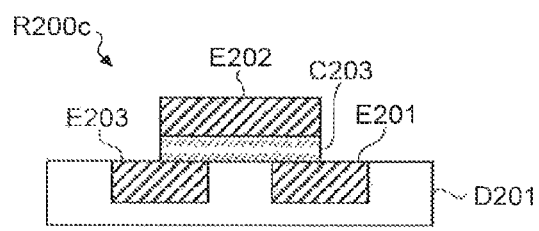
FIG. 38 is a view illustrating a different structure example of the three-terminal variable resistance memory according to the eleventh embodiment.

FIG. 36 to FIG. 38 are views illustrating structure examples of the three-terminal variable resistance memory according to the eleventh embodiment. A resistive memory R200a illustrated in FIG. 36 includes a configuration in which an electrode E202 for writing a resistance value and two variable resistance materials C201 and C202 are provided in such a manner as to bridge two electrodes E201 and E203 for reading a resistance value. In a case of writing a resistance value, an intended bias voltage is applied to the electrodes E202 and E201 and the electrodes E202 and E203. Here, it is assumed that a potential of the electrode E201 and that of the electrode E202 are the same. Accordingly, an intended resistance value is written into the resistive memory R200a. Also, in a case of reading a resistance value, current corresponding to a resistance value flows between the electrodes E201 and E203. In a structure illustrated in FIG. 36, since the electrode E201 and the electrode E203 are symmetric structures, a characteristic as a resistance element with respect to both positive and negative polarities is improved.

Also, as illustrated in a variable resistance memory R200b in FIG. 37, a structure in which electrodes E201, 202, and 203 are arrayed vertically and are connected to each other through variable resistance materials C201 and C202 may be included. Moreover, as illustrated in a variable resistance memory R200c in FIG. 38, a lateral structure in which one variable resistance material C203 is sandwiched by three electrodes E201 to E203 may be included. In this case, a reading current may flow from the electrode E201 to the electrode E203 through the variable resistance material C203 and the electrode E202 or may flow in a boundary part between the variable resistance material E203 and an insulator D201. For example, when each of the electrodes E201 and E203 includes metal such as copper (Cu), a metal ion diffuses in the boundary part between the variable resistance material C203 and the insulator D201. Accordingly, a current path of an intended resistance value is formed. Also, the configuration illustrated in FIG. 38 may be a longitudinal structure as illustrated in a variable resistance memory R200d in FIG. 33.

Figure 39:
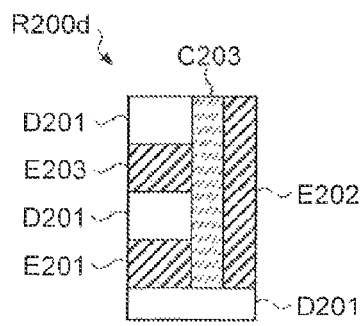
FIG. 39 is a view illustrating a different structure example of the three-terminal variable resistance memory according to the eleventh embodiment.

Note that the structure illustrated in FIG. 36 or FIG. 37 has an advantage that production is easily performed. Also, the structure illustrated in FIG. 38 or FIG. 39 has an advantage that an occupation area can be reduced.

A different configuration, effect, and operation are similar to those of the other embodiments, and thus, a description thereof is omitted. For example, an imaging apparatus according to the eleventh embodiment may be similar to the imaging apparatus 5 illustrated in FIG. 32.

Twelfth Embodiment

Also, in the ninth to eleventh embodiments, a case where a resistance value of each of the resistance elements R1 to R10 is previously set has been described as an example. But this is not the limitation. For example, each time a value in each layer is read from a scanning circuit 11A or 11B, a resistance value of a variable resistance element VR11 may be set. Note that in the present embodiment, a case where a three-terminal resistive memory is used will be described as an example. However, a configuration including a combination of a two-terminal resistive memory and a selection transistor may be included.

Figure 40:
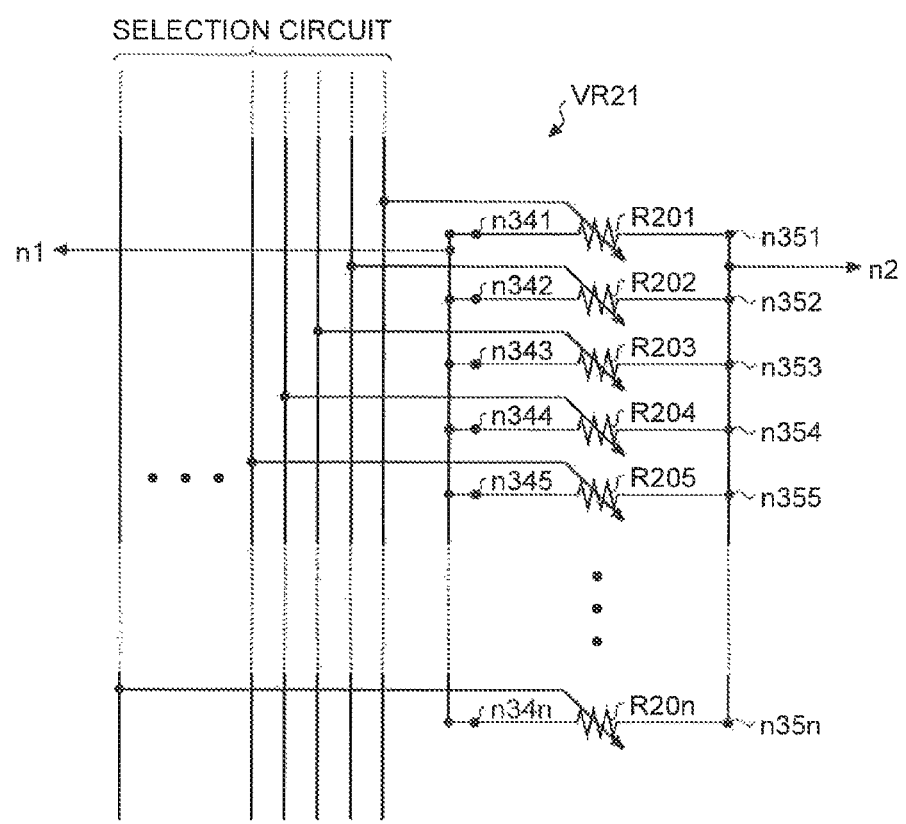
FIG. 40 is a circuit diagram illustrating an example of a variable resistance element including a three-terminal resistive memory according to a twelfth embodiment.

FIG. 40 is a circuit diagram illustrating an example of a variable resistance element including a three-terminal resistive memory according to the twelfth embodiment. As illustrated in FIG. 40, a variable resistance element VR21 includes a configuration in which resistive memories R201 to R20n (n is positive integer such as 400) are connected in parallel in multiple stages. When both of variable resistance elements VR1 and VR2 are respectively replaced by variable resistance elements VR11, the number of parallel stages may be different from each other.

The resistive memories R201 to R20n connected in parallel in multiple stages are not measured like the resistance elements R1 to R10 and operate as one resistance element as a whole. Thus, in writing of a resistance value, resistive memories, the number of which corresponds to a target resistance value, are selected by a selection circuit. However, similarly to the tenth embodiment, writing of a resistance value may not be performed with respect to each of the variable resistance memories R201 to R20n included in the variable resistance element VR21 but may be performed with respect to a whole resistance element selected as an object of writing. Also, Verify of a writing state may be executed or omitted.

A different configuration, effect, and operation are similar to those of the other embodiments, and thus, a description thereof is omitted. For example, an imaging apparatus according to the twelfth embodiment may be similar to the imaging apparatus 5 illustrated in FIG. 32.

Thirteenth Embodiment

In the thirteen embodiment, a configuration example of the variable resistance memory described as an example in each of the tenth to twelfth embodiments will be described in detail with reference to the drawings. In the following description, a description will be made with a focus on the variable resistance element R201 described as an example in the twelfth embodiment. However, application to any of the other resistance elements R202 to R20n, R1 to R10, R20 to R24, and R30 to R39 is possible.

Figure 41:
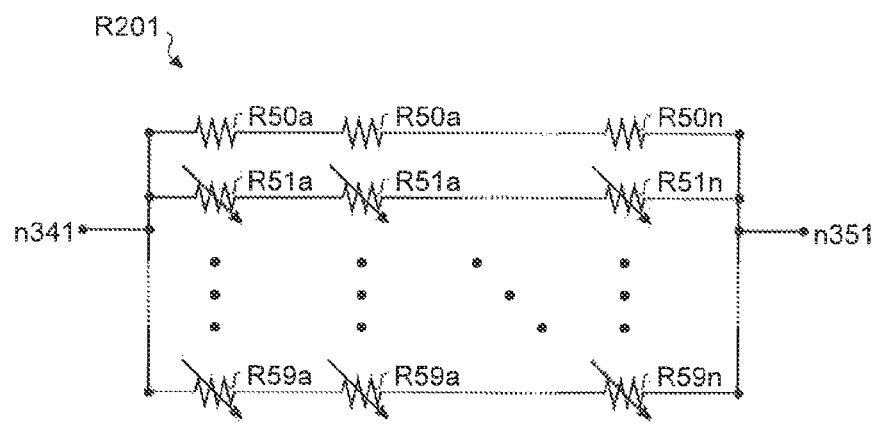
FIG. 41 is a circuit diagram illustrating a configuration example of a resistance element according to a thirteenth embodiment.

FIG. 41 is a circuit diagram illustrating a configuration example of a resistance element according to the thirteenth embodiment. As illustrated in FIG. 41, a configuration of the resistance element R201 is not limited to a configuration using a single variable resistance memory and may be a configuration using a plurality of variable resistance memories R50a to R59n.

Figure 42:
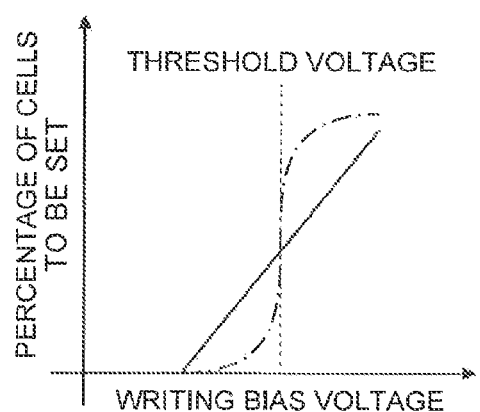
FIG. 42 is a view illustrating a relationship between a writing bias voltage and the number of sets according to the thirteenth embodiment.

In an example illustrated in FIG. 41, a plurality of variable resistance memories R50a to R59n is connected in series parallel. In such a configuration, it becomes possible to stochastically control a change of a resistance value in each serially-connected array. This will be described with reference to FIG. 42. FIG. 42 is a view illustrating a relationship between a writing bias voltage and the number of sets. Note that a set means switching of resistance values. Note that a writing bias voltage in FIG. 42 can be replaced by a writing current or the number of times of writing.

As indicated by a dashed-dotted line in FIG. 42, in one variable resistance memory element, when transition from a low resistance state corresponding to information "0" to a high resistance state corresponding to information "1" is performed due to a pulsed writing voltage, a success probability of writing changes steeply around a threshold voltage. Thus, the number of cells (hereinafter, referred to as number of sets) in which resistance values are switched (set) is increased suddenly around the threshold value. On the other hand, as indicated by a solid line in FIG. 42, in the present embodiment in which a plurality of variable resistance memories is connected in series parallel, a change of resistance with respect to a writing bias voltage is substantially in a linear shape. This indicates that controllability of a resistance value is higher in the present embodiment. Thus, by controlling a writing bias voltage applied between nodes n341 and n351 in FIG. 41, it is possible to control tire number of sets of the variable resistance memories R50a to R59n. As a result, it becomes possible to set resistance values of the variable resistance memories R50a to R59n in multiple stages. Also, by designing a resistive memory array in consideration of variation during production, it is possible to make a relationship between a writing bias voltage and the number of sets closer to a linear shape.

Also, in the thirteenth embodiment, since a selection transistor of each of the variable resistance memories R50a to R59n is not necessary, it is possible to increase the number of variable resistance memories R50a to R59n in parallel. Moreover, since it becomes possible to change resistance values of the variable resistance memories R50a to R59n at once, it becomes possible to perform switching of resistance values at high speed.

A different configuration, effect, and operation are similar to those of the other embodiments, and thus, a description thereof is omitted.

First Modification of Thirteenth Embodiment

Figure 43:
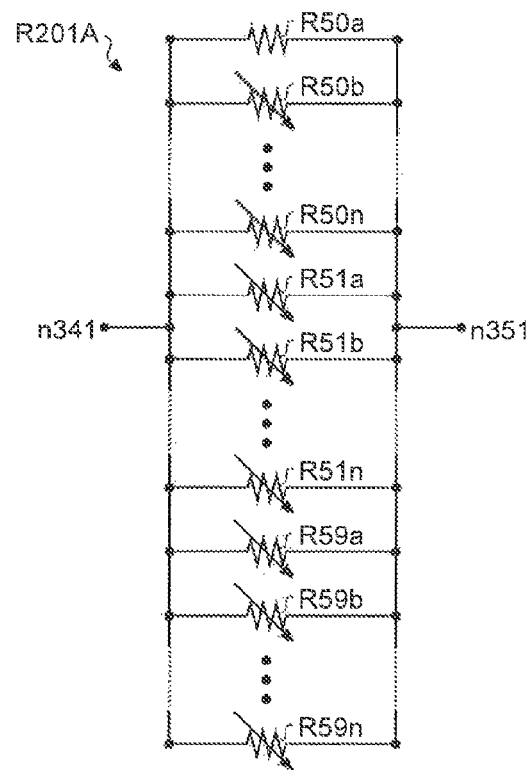
FIG. 43 is a circuit diagram illustrating a configuration example a resistance element according to a first modification of the thirteenth embodiment.

In the thirteenth embodiment, a case where the variable resistance memories R50a to R59n are connected in series parallel has been described as an example. However, this array is not the limitation. For example, as illustrated in a resistance element R201A in FIG. 43, by connecting the variable resistance memories R50a to R59n in parallel, it is possible to stochastically control a change of a resistance value in each array.

Figure 44:
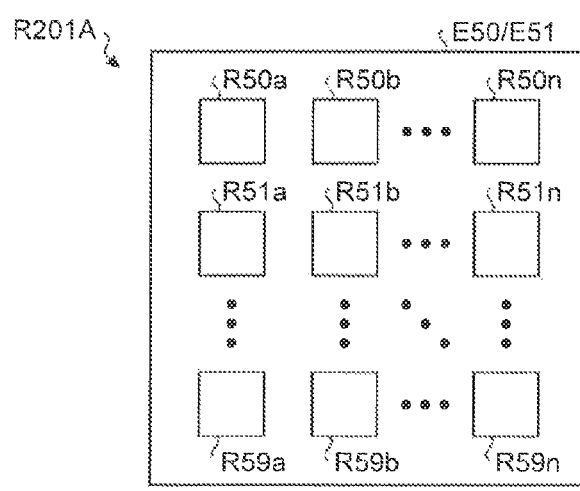
FIG. 44 is a layout diagram illustrating a configuration example of a resistance element according to the first modification of the thirteenth embodiment.

Also, for example, as illustrated in FIG. 44, in a layout of the variable resistance memories R50a to R59n connected in parallel, the variable resistance memories R50a to R59n can be two-dimensionally arrayed between electrodes E50 and E51 arranged on an upper side and on a lower side. By using the layout illustrated in FIG. 44, it is possible to make a wiring line layer, where the variable resistance memories R50a to R59n are arranged, a single layer. Thus, it is possible to reduce the number of production steps.

Note that in the configuration in which the variable resistance memories R50a to R59n are connected in parallel, a variable resistance memory in which resistance values are switched by current can be used. However, in view of controllability of a resistance value, it is preferable to use a variable resistance memory in which resistance values are switched by a voltage value.

Second Modification of Thirteenth Embodiment

Figure 45:
FIG. 45 is a circuit diagram illustrating a configuration example a resistance element according to a second modification of the thirteenth embodiment.
Figure 46:
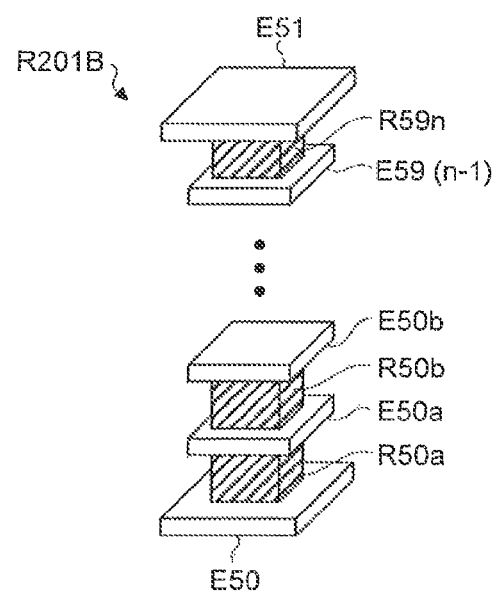
FIG. 46 is a view illustrating a structure example of a resistance element according to the second modification of the thirteenth embodiment.

Also, as illustrated in a resistance element R201B in each of FIG. 45 and FIG. 46, by connecting variable resistance memories R50a to R59n in series, it is possible to stochastically control a change of a resistance value in each array.

When the plurality of variable resistance memories R50a to R59n are connected in series, a resistance value of a whole resistance element R201B directly corresponds to the number of variable resistance memories R50a to R59n in which resistance values are changed. This means that controllability of a resistance value is high. Also, since it becomes easy to design a peripheral circuit which performs writing control with high controllability, it becomes possible to reduce a circuit area or a period of control processing.

Note that in the configuration in which the variable resistance memories R50a to R59n are connected in series, a variable resistance memory in which resistance values are switched by a voltage value can be used. However, in view of controllability of a resistance value, it is preferable to use a variable resistance memory in which resistance values are switched by current.

For example, in a case where a resistance value of when an information amount of whole N variable resistance memories connected in series is "0" is R1, a resistance value of when an information amount is "1" is R2, and R2=k×R1, a resistance value of the whole variable resistance memories can be changed from N×R1 to N×k×R1. More specifically, when N is 100, R1 is 1 kΩ, and R2 is 2 kΩ, k=2 and a resistance value can be changed from 100 kΩ to 200 kΩ.

Also, for example, when a resistance value is set at 100 kΩ and a pulse (writing bias voltage) in which a resistance value changes from information "0" (low resistance) to information "1" (high resistance) at a probability of 1% is applied, one piece among 100 pieces of information may be rewritten. Thus, it can be expected that the resistance value becomes 101 kΩ. When a resistance value of 150 kΩ is necessary, a pulse (writing bias voltage) in which a resistance value changes at a probability of 50% is to be applied.

Also, when a resistance value becomes too large, in a method to correct an error, a pulse (writing bias voltage) in which information "1" (high resistance) is rewritten as information "0" (low resistance) is applied and the resistance value is gradually decreased. In the error correction, a reading current may be converted into a digital value by an analog/digital converter or control may be performed by comparing a current voltage of the read analog current as it is with current flowing in reference resistance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imaging element comprising:
a plurality of light receiving elements;
a plurality of scanning circuits respectively connected to the plurality of light receiving elements;
a first wiring line comprising a plurality of nodes; and
a plurality of first variable resistance elements, each connected between a corresponding one of the nodes and a corresponding one of the scanning circuits,
wherein at least one of the first variable resistance elements includes a plurality of resistance elements connected to each other in parallel.

2. The imaging element according to claim 1, wherein at least one of the first variable resistance elements further include a plurality of selection transistors respectively connected to the plurality of resistance elements in series.

3. The imaging element according to claim 1, wherein at least one of the plurality of resistance elements is a three-terminal element including two terminals for reading a resistance value and one terminal for writing a resistance value.

4. The imaging element according to claim 1, wherein at least one of the plurality of resistance elements includes a plurality of resistive memories connected to each other in series, in parallel, or in series parallel.

5. The imaging element according to claim 4, wherein at least one of the resistive memories includes at least one of an ReRAM, an MRAM, a PRAM, an ion memory, an amorphous silicon memory, and a polysilicon memory.

6. An imaging apparatus comprising:
the imaging element according to claim 1; and
a controller configured to control a resistance value of at least one of the first variable resistance elements to read am image signal from the imaging element,
wherein after reading a first image signal from the imaging element with a resistance value of at least one of the first variable resistance elements as a first resistance value, the controller reads a second image signal from the imaging element with the resistance value of the at least one of the first variable resistance elements as a second resistance value different from the first resistance value.

7. An imaging element comprising:
a plurality of light receiving elements;
a plurality of scanning circuits respectively connected to the plurality of light receiving elements;
a first wiring line comprising a plurality of nodes; and
a plurality of second variable resistance elements, each connected between adjacent nodes of the first wiring,
wherein at least one of the second variable resistance elements includes a plurality of resistance elements connected to each other in parallel.

8. The imaging element according to claim 7, further comprising a plurality of first variable resistance elements, each connected between a corresponding one of the nodes and a corresponding one of the scanning circuits.

9. The imaging element according to claim 7, wherein at least one of the second variable resistance elements further include a plurality of selection transistors respectively connected to the plurality of resistance elements in series.

10. The imaging element according to claim 7, wherein at least one of the plurality of resistance elements is a three-terminal element including two terminals for reading a resistance value and one terminal for writing a resistance value.

11. The imaging element according to claim 7, wherein at least one of the plurality of resistance elements includes a plurality of resistive memories connected to each other in series, in parallel, or in series parallel.

12. The imaging element according to claim 11, wherein at least one of the resistive memories includes at least one of an ReRAM, an MRAM, a PRAM, an ion memory, an amorphous silicon memory, and a polysilicon memory.

13. An imaging apparatus comprising:
the imaging element according to claim 7; and
a controller configured to control a resistance value of at least one of the second variable resistance elements to read an image signal from the imaging element,
wherein after reading a first image signal from the imaging element with a resistance value of at least one of the second variable resistance elements as a first resistance value, the controller reads a second image signal from the imaging element with the resistance value of the at least one of the second variable resistance elements as a second resistance value different from the first resistance value.

14. An imaging element comprising:
a plurality of light receiving elements;
a plurality of scanning circuits respectively connected to the plurality of light reserving elements;
a first wiring line comprising a plurality of nodes;
a plurality of first variable resistance elements, each connected between a corresponding one of the nodes and a corresponding one of the scanning circuits; and
a plurality of switching transistors, each connected between a corresponding one of the first variable resistance elements and a corresponding one of the nodes or between a corresponding one of the first variable resistance elements and a corresponding one of the scanning circuits.

15. The imaging element according to claim 14, wherein at least one of the first variable resistance elements includes a plurality of resistance elements connected to each other in parallel.

16. The imaging element according to claim 15, wherein at least one of the plurality of resistance elements includes a plurality of resistive memories connected to each other in series, in parallel, or in series parallel.

17. The imaging element according to claim 16, wherein at least one of the resistive memories includes at least one of an ReRAM, an MRAM, a PRAM, an ion memory, an amorphous silicon memory, and a polysilicon memory.

18. The imaging element according to claim 15, wherein at least one of the first variable resistance elements further include a plurality of selection transistors respectively connected to the plurality of resistance elements in series.

19. The imaging element according to claim 15, wherein at least one of the plurality of resistance elements is a three-terminal element including two terminals for reading a resistance value and one terminal for writing a resistance value.

20. An imaging apparatus comprising:
the imaging element according to claim 14; and
a controller configured to control a resistance value of at least one of the first variable resistance elements to read an image signal from the imaging element,
wherein after reading a first image signal from the imaging element with a resistance value of at least one of the first variable resistance elements as a first resistance value, the controller reads a second image signal from the imaging element with the resistance value of the at least one of the first variable resistance elements as a second resistance value different from the first resistance value.

* * * * *